(12) United States Patent
Chang et al.

(10) Patent No.: US 12,399,431 B2
(45) Date of Patent: Aug. 26, 2025

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Shih-Ming Chang, Hsinchu (TW); Minfeng Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 766 days.

(21) Appl. No.: 17/651,741

(22) Filed: Feb. 18, 2022

(65) Prior Publication Data

US 2023/0152709 A1  May 18, 2023

Related U.S. Application Data

(60) Provisional application No. 63/264,057, filed on Nov. 15, 2021.

(51) Int. Cl.
| | |
|---|---|
| *G03F 7/20* | (2006.01) |
| *G02B 5/08* | (2006.01) |
| *G02B 5/30* | (2006.01) |
| *G03F 7/00* | (2006.01) |
| *H01L 21/027* | (2006.01) |

(52) U.S. Cl.
CPC ....... *G03F 7/70191* (2013.01); *G02B 5/0891* (2013.01); *G02B 5/3041* (2013.01); *G03F 7/70116* (2013.01); *H01L 21/0274* (2013.01)

(58) Field of Classification Search
CPC ............ G03F 7/70191; G03F 7/70116; G03F 7/70075; G03F 7/70566; G02B 5/0891; G02B 5/3041; H01L 21/0274
See application file for complete search history.

(56) References Cited

U.S. PATENT DOCUMENTS

| | | | |
|---|---|---|---|
| 2014/0111785 A1* | 4/2014 | Hennerkes | G02B 26/0816 359/845 |
| 2018/0224751 A1* | 8/2018 | Voogd | G03F 7/70508 |

* cited by examiner

*Primary Examiner* — Mesfin T Asfaw
(74) *Attorney, Agent, or Firm* — Harrity & Harrity, LLP

(57) ABSTRACT

An illumination system includes a plurality of pixels (or spots) that are (or may be) configured in one or more polarization configuration types. The pixels of the illumination system may be configured to promote particular types of polarization (e.g., transverse electric (TE) polarization, transvers magnetic (TM) polarization) to increase pattern contrast while achieving suitable exposure operation throughput. Moreover, the pixels of the pixels of the illumination system may be configured to achieve free-form (arbitrary or freely-configurable) polarization, which permits the polarization of radiation to be tailored to particular exposure operation patterns and other parameters.

20 Claims, 19 Drawing Sheets

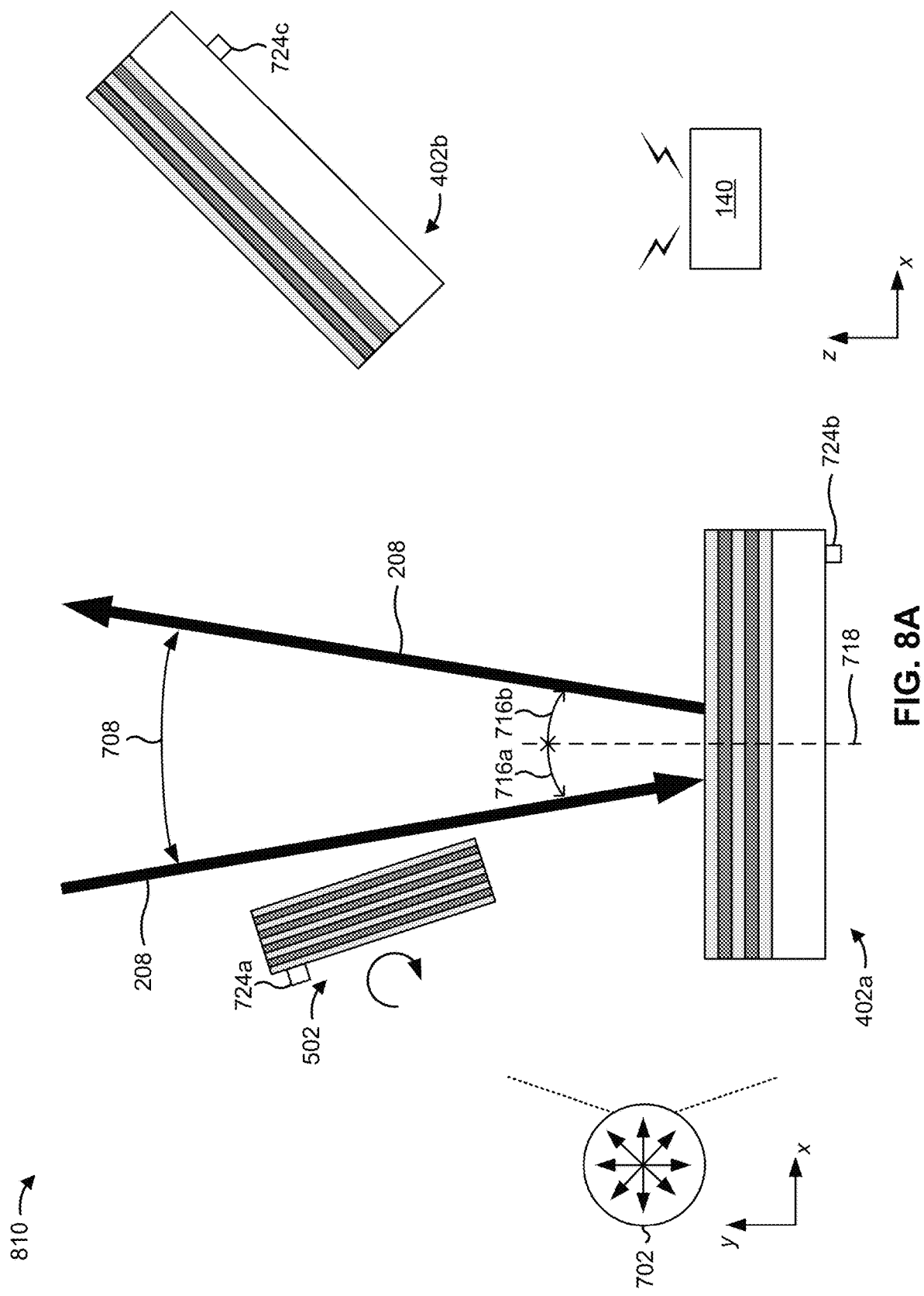

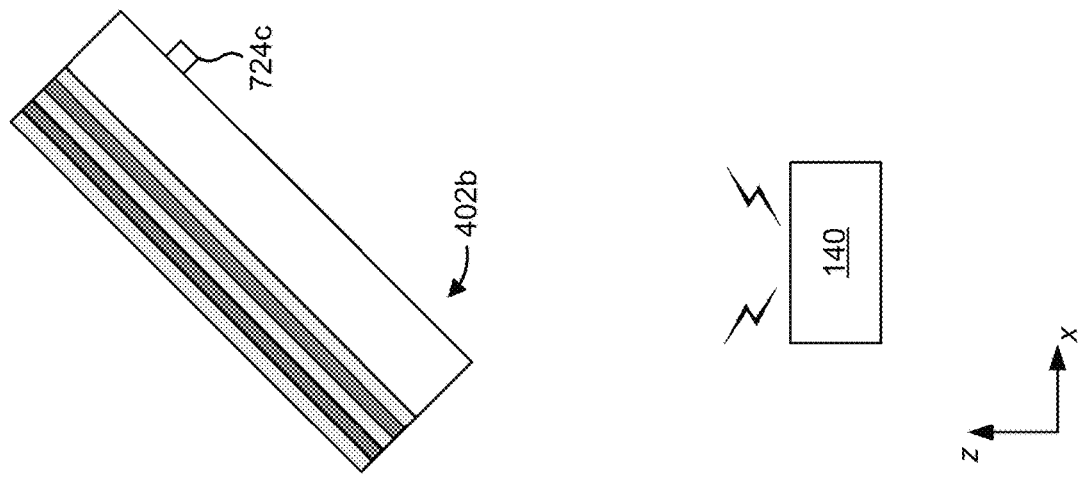
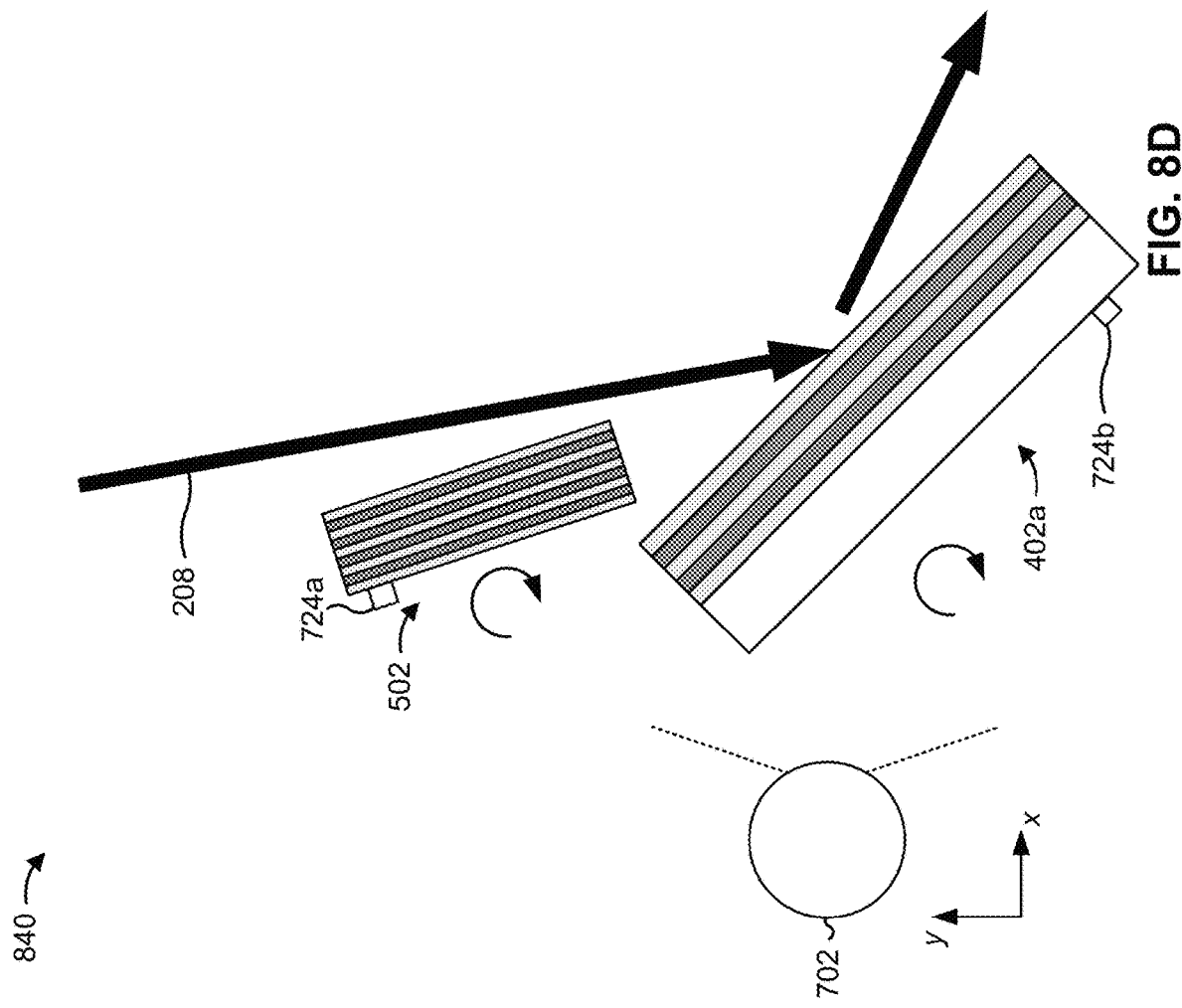
FIG. 8D

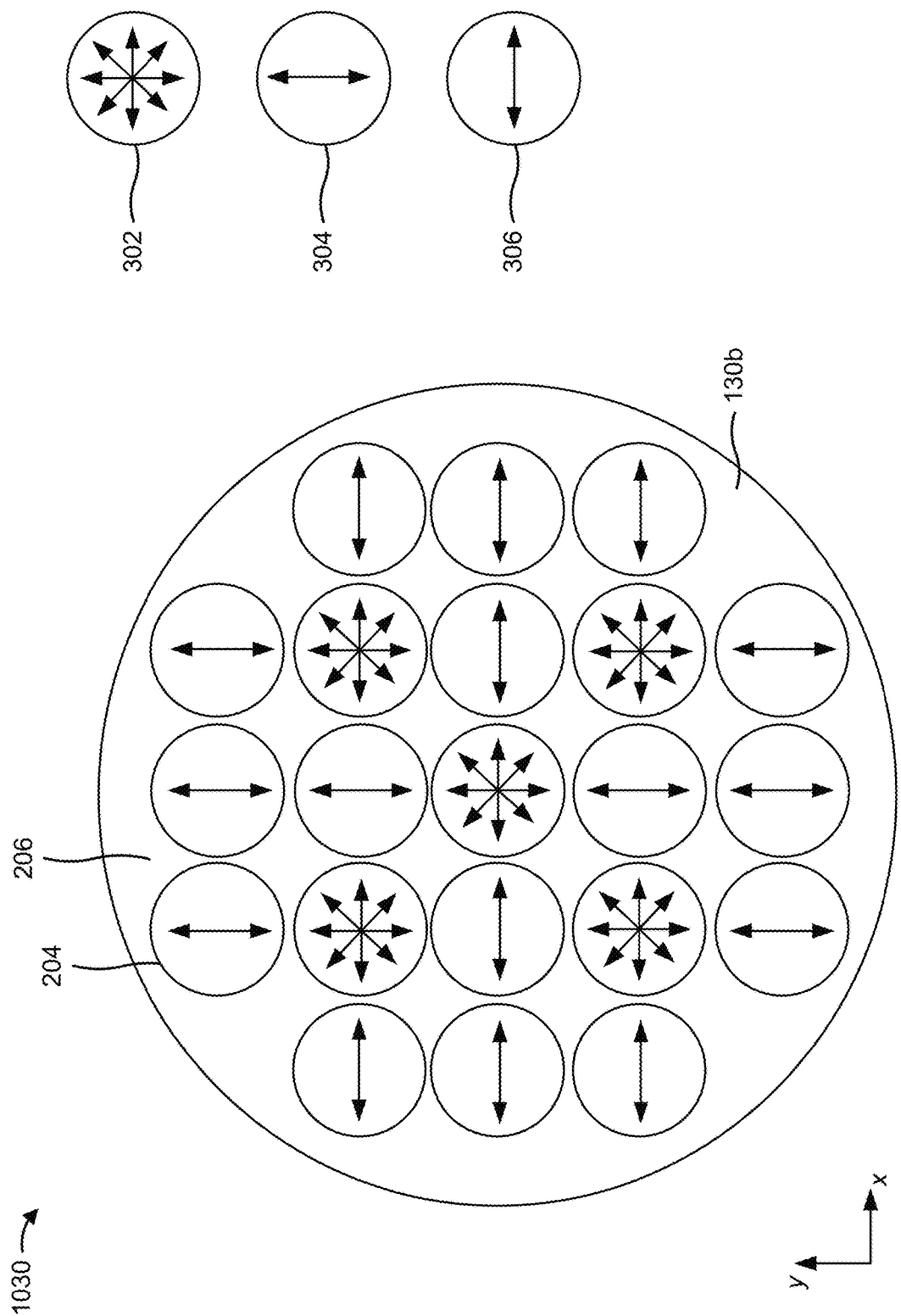

SEMICONDUCTOR PROCESSING TOOL AND METHODS OF OPERATION

CROSS-REFERENCE TO RELATED APPLICATION

This Patent Application claims priority to U.S. Provisional Patent Application No. 63/264,057, filed on Nov. 15, 2021, and entitled "SEMICONDUCTOR PROCESSING TOOL AND METHODS OF OPERATION." The disclosure of the prior Application is considered part of and is incorporated by reference into this Patent Application.

BACKGROUND

As semiconductor device sizes continue to shrink, some lithography technologies suffer from optical restrictions, which lead to resolution issues and reduced lithography performance. In comparison, extreme ultraviolet (EUV) lithography can achieve much smaller semiconductor device sizes and/or feature sizes through the use of reflective optics and radiation wavelengths of approximately 13.5 nanometers or less.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7, 8A-8D, and 9 are diagrams of example implementations of configurable pixels described herein.

FIGS. 10A-10C are diagrams of example pixel configurations for an illumination system described herein for use in the lithography system of FIG. 1.

DETAILED DESCRIPTION

Figure 1:
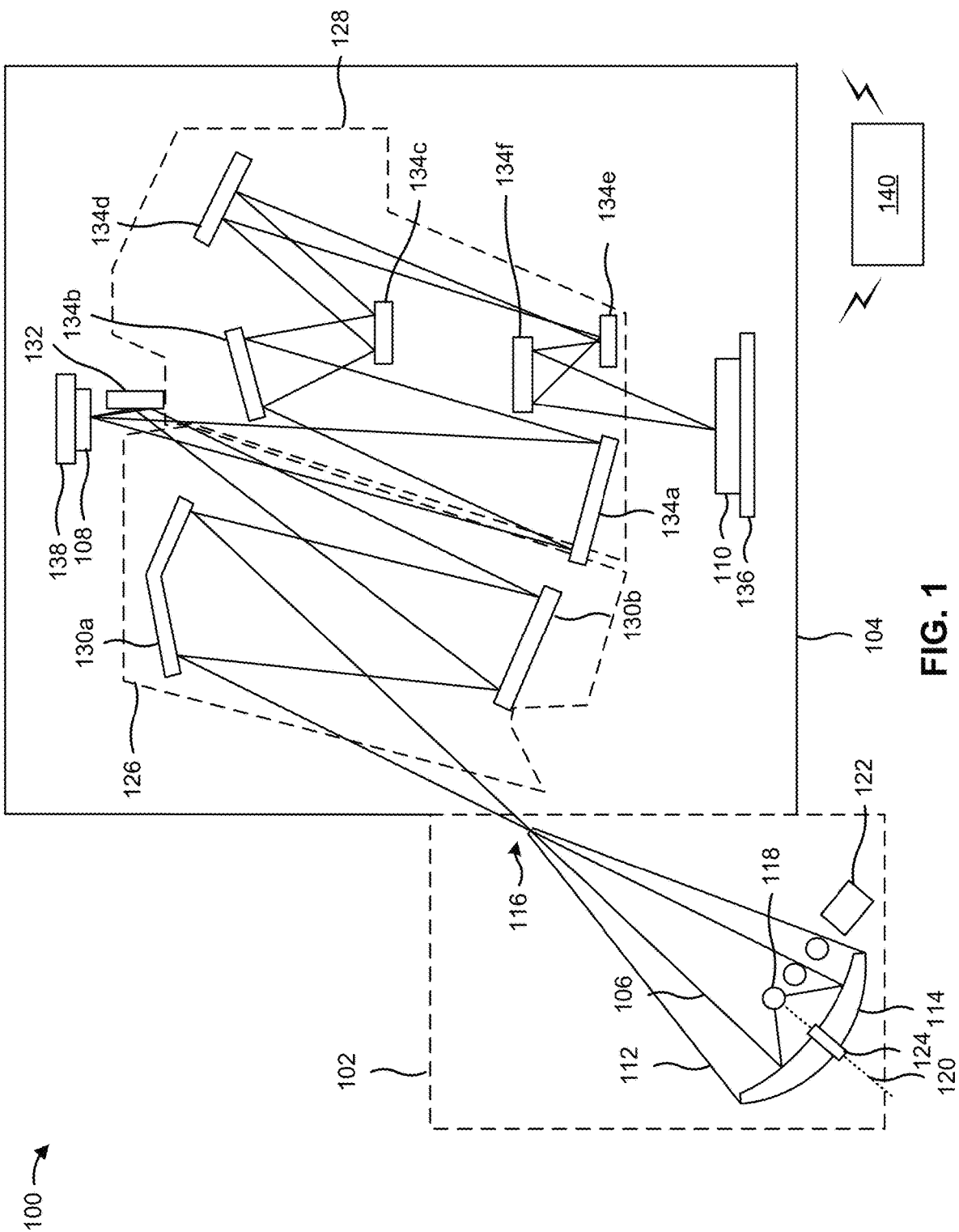
FIG. 1 is a diagram of an example lithography system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As pattern sizes continue to decrease in advanced semiconductor fabrication processes, the ability to transfer a high-contrast image patterns onto a semiconductor substrate in a lithography exposure operation becomes more difficult. Numerical aperture sizes may be increased (to 0.55 or greater, as an example) in advanced semiconductor fabrication processes, which may lead to reduced contrast and reduced interference efficiency. This may result in reduced lithography throughput, reduced pattern quality, reduced semiconductor device yield and performance, and/or an increase in semiconductor defects, among other examples.

Some implementations described herein provide an illumination system for use in a lithography system (e.g., an EUV lithography system or another type of lithography system) and associated methods of operation. The illumination system includes a plurality of pixels (or spots) that are (or may be) configured in one or more polarization configuration types. In this way, the pixels of the illumination system may be configured to promote particular types of polarization (e.g., transverse electric (1E) polarization, transverse magnetic (TM) polarization) to increase pattern contrast while achieving suitable exposure operation throughput. Moreover, the pixels of the illumination system may be configured to achieve free-form (arbitrary or freely-configurable) polarization, which permits the polarization of radiation to be tailored to particular exposure operation patterns and other parameters.

FIG. 1 is a diagram of an embodiment of a lithography system 100 described herein. The lithography system 100 includes an EUV lithography system or another type of lithography system that is configured to transfer a pattern to a semiconductor substrate using mirror-based optics. The lithography system 100 may be configured for use in a semiconductor processing environment such as a semiconductor foundry or a semiconductor fabrication facility.

As shown in FIG. 1, the lithography system 100 includes the radiation source 102 and an exposure tool 104. The radiation source 102 (e.g., an EUV radiation source or another type of radiation source) is configured to generate radiation 106 such as EUV radiation and/or another type of electromagnetic radiation (e.g., light, EUV light). The exposure tool 104 (e.g., an EUV scanner or another type of exposure tool) is configured to focus the radiation 106 onto a reflective reticle 108 (or a photomask) such that a pattern is transferred from the reticle 108 onto a semiconductor substrate 110 using the radiation 106.

The radiation source 102 includes a vessel 112 and a collector 114 in the vessel 112. The collector 114, includes a curved mirror that is configured to collect the radiation 106 generated by the radiation source 102 and to focus the radiation 106 toward an intermediate focus 116. The radiation 106 is produced from a plasma that is generated from droplets 118 (e.g., tin (Sn) droplets or another type of droplets) being exposed to a laser beam 120. The droplets 118 are provided across the front of the collector 114 by a droplet generator (DG) head 122. The DG head 122 is pressurized to provide a fine and controlled output of the droplets 118.

A laser source, such as a pulse carbon dioxide ($CO_2$) laser, generates the laser beam 120. The laser beam 120 is provided (e.g., by a beam delivery system to a focus lens) such that the laser beam 120 is focused through a window 124 of the collector 114. The laser beam 120 is focused onto the droplets 118 which generates the plasma. The plasma produces a plasma emission, some of which is the radiation 106. The laser beam 120 is pulsed at a timing that is synchronized with the flow of the droplets 118 from the DG head 122.

The exposure tool 104 includes an illuminator 126 and a projection optics box (POB) 128. The illuminator 126 includes a plurality of reflective mirrors that are configured to focus and/or direct the radiation 106 onto the reticle 108 so as to illuminate the pattern on the reticle 108. The plurality of mirrors include, for example, a mirror 130a and a mirror 130b (referred to herein as an illumination system 130b). The mirror 130a includes a field facet mirror (FFM) or another type of mirror that includes a plurality of field facets. The illumination system 130b includes a pupil facet mirror (PFM) or another type of mirror that also includes a plurality of pupil facets, pixels, or illumination spots. As described herein, the pixels of the illumination system 130b are arranged (and/or are capable of being configured) to turn on/off, focus, polarize, and/or otherwise tune the radiation 106 from the radiation source 102 to increase or emphasize particular types of radiation components (e.g., transverse electric (TE) polarized radiation, transverse magnetic (TM) polarized radiation). This enables the illumination system 130b to increase the uniformity or change the intensity distribution of the radiation 106 and increase the contrast of the pattern of the reticle 108 transferred to the semiconductor substrate 110. Another mirror 132 (e.g., a relay mirror) is included to direct radiation 106 from the illuminator 126 onto the reticle 108.

The projection optics box 128 includes a plurality of mirrors that are configured to project the radiation 106 onto the semiconductor substrate 110 after the radiation 106 is modified based on the pattern of the reticle 108. The plurality of reflective mirrors include, for example, mirrors 134a-134f. In some implementations, the mirrors 134a-134f are configured to focus or reduce the radiation 106 into an exposure field, which may include one or more die areas on the semiconductor substrate 110.

The exposure tool 104 includes a substrate stage 136 (e.g., a wafer stage) configured to support the semiconductor substrate 110. Moreover, the substrate stage 136 is configured to move (or step) the semiconductor substrate 110 through a plurality of exposure fields as the radiation 106 transfers the pattern from the reticle 108 onto the semiconductor substrate 110. The exposure tool 104 also includes a reticle stage 138 that configured to support and/or secure the reticle 108. Moreover, the reticle stage 138 is configured to move or slide the reticle through the radiation 106 such that the reticle 108 is scanned by the radiation 106. In this way, a pattern that is larger than the field or beam of the radiation 106 may be transferred to the semiconductor substrate 110. A controller 140 included in the lithography system 100 (e.g., in the exposure tool 104 or another component of the lithography system 100) is configured to communicate with and/or control actions of various components and/or subsystems of the lithography system 100, including the radiation source 102 and/or the exposure tool 104, among other examples. In some implementations, the controller 140 transmits signals to the lithography system 100 and/or the components thereof (e.g., the radiation source 102, the exposure tool 104) to cause the lithography system 100 and/or the components thereof (e.g., the radiation source 102, the exposure tool 104) to perform an exposure operation.

In an example exposure operation (e.g., an EUV exposure operation), the DG head 122 provides the stream of the droplets 118 across the front of the collector 114. The laser beam 120 contacts the droplets 118, which causes a plasma to be generated. The plasma emits or produces the radiation 106 (e.g., EUV light). The radiation 106 is collected by the collector 114 and directed out of the vessel 112 and into the exposure tool 104 toward the mirror 130a of the illuminator 126. The mirror 130a reflects the radiation 106 onto the illumination system 130b, which reflects the radiation 106 onto the mirror 132 toward the reticle 108. The radiation 106 is modified by the pattern in the reticle 108. In other words, the radiation 106 reflects off of the reticle 108 based on the pattern of the reticle 108. The reflective reticle 108 directs the radiation 106 toward the mirror 134a in the projection optics box 128, which reflects the radiation 106 onto the mirror 134b. The radiation 106 continues to be reflected and reduced in the projection optics box 128 by the mirrors 134c-134f. The mirror 134f reflects the radiation 106 onto the semiconductor substrate 110 such that the pattern of the reticle 108 is transferred to the semiconductor substrate 110. The above-described exposure operation is an example, and the lithography system 100 may operate according to other EUV techniques and radiation paths that include a greater quantity of mirrors, a lesser quantity of mirrors, and/or a different configuration of mirrors.

As indicated above, FIG. 1 is provided as an example. Other examples may differ from what is described with regard to FIG. 1.

Figure 2:
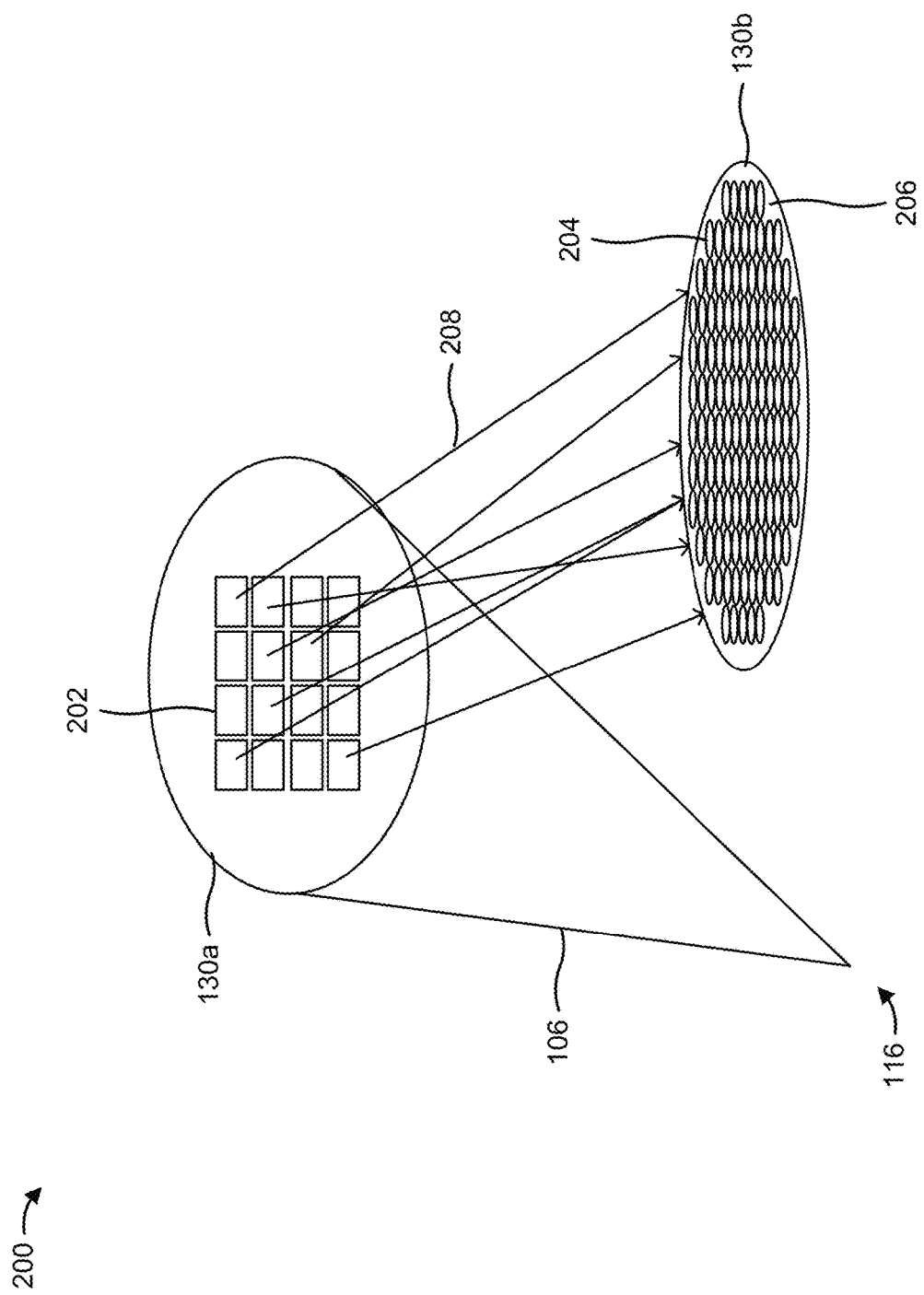
FIG. 2 is a diagram of an example implementation described herein.

FIG. 2 is a diagram of an example implementation 200 described herein. The example implementation 200 includes an example operation of the mirror 130a and the illumination system 130b. As shown in FIG. 2, the mirror 130a includes a plurality of mirror facets 202. The mirror facets 202 may include rectangular-shaped mirror facets, square-shaped mirror facets, and/or may include another shape of mirror facets. The mirror facets 202 are configured to receive the radiation 106 and split the radiation 106 into individual or separate beams of radiation. In this way, the mirror facets 202 are configured to tune, modify, or adjust the radiation 106.

As further shown in FIG. 2, the illumination system 130b includes a plurality of pixels 204 on a substrate 206. The pixels 204 include various components described herein, including mirrors, polarizers, and/or actuators, among other examples. The pixels 204 are configured to receive the beams of radiation from the mirror facets 202 and reflect (or redirect) the beams of radiation toward the reticle 108 (or other intervening mirrors). In some implementations, the pixels 204 include approximately circle-shaped structures that are arranged in a grid pattern or another pattern on the substrate 206. In some implementations, the pixels 204 include microelectromechanical systems (MEMS) that include the mirrors, polarizers, and/or actuators, described herein. In these implementations the MEMS of the pixels 204 (and the mirrors, polarizers, and/or actuators, described herein) may be formed by various MEMS fabrication and/or processing techniques.

In some implementations, the mirror 130a includes on the order of hundreds of mirror facets 202. For examples, the mirror 130a may include 300 or more mirror facets 202 or another quantity of mirror facets 202. In some implementations, the illumination system 130b includes on the order of thousands of pixels 204 or more. For examples, the illumination system 130b may include 1000 or more pixels 204 or another quantity of pixels 204. In some implementations, a subset of the mirror facets 202 and a subset of the pixels 204 are activated in an exposure operation of the lithography system 100.

As further shown in FIG. 2, the radiation 106 may be directed from the intermediate focus 116 and toward the mirror 130a (e.g., by the radiation source 102). The radiation 106 incident upon the mirror 130a (or a portion thereof) is reflected off the mirror facets 202. The reflected radiation 208 is directed toward the pixels 204 of the illumination system 130b as a plurality of beams. Each respective beam of the reflected radiation 208 is incident upon one or more pixels 204 of the illumination system 130b. Radiation in reflected off the pixels 204 and toward the reticle 108 (or other intervening mirrors). In some implementations, the reflected radiation 208 includes unpolarized EUV radiation, and the pixels 204 are configured to modify the unpolarized EUV radiation in various ways including polarizing the unpolarized EUV radiation. Thus, the EUV radiation reflected by the pixels 204 may include TE polarized EUV radiation, TM polarized EUV radiation, unpolarized EUV radiation, or a combination thereof.

As indicated above, FIG. 2 is provided as an example. Other examples may differ from what is described with regard to FIG. 2.

Figure 3:
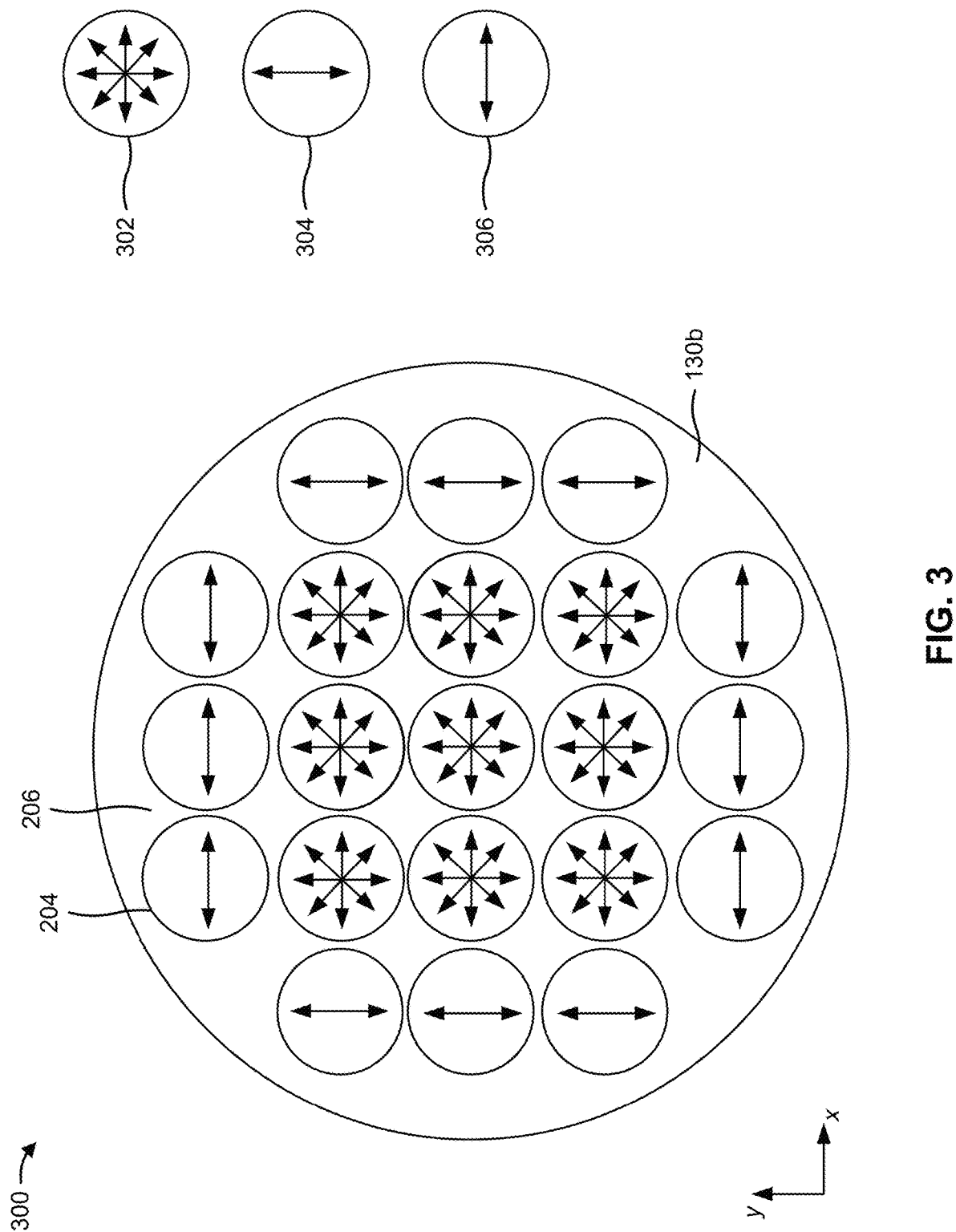
FIG. 3 is a diagram of an example pixel configuration for an illumination system described herein for use in the lithography system of FIG. 1.

FIG. 3 is a diagram of an example implementation 300. The example implementation 300 illustrates a plurality of polarization configurations for the pixels 204 of the illumination system 130b described herein for use in the lithography system of FIG. 1. As shown in FIG. 3, the pixels 204 are arranged in a grid pattern on the substrate 206. However, the pixels 204 may be arranged in another pattern, such as a staggered pattern (e.g., a brick pattern), an asymmetric pattern, a non-uniform pattern, and/or another type of pattern.

As further shown in FIG. 3, the pixels 204 are configured to reflect a particular type of radiation (e.g., EUV radiation). In particular, a pixel 204 may be configured as an unpolarized pixel 302 (e.g., in an unpolarized polarization configuration), a TE polarized pixel 304 (e.g., in a TE polarized polarization configuration), or a TM polarized pixel 306 (e.g., in a TM polarized polarization configuration). In some implementations, a pixel 204 may be configured as a plurality of polarization types (e.g., TE polarization and TM polarization), as described herein.

An unpolarized pixel 302 includes a pixel 204 that is configured to reflect unpolarized radiation (e.g., unpolarized EUV radiation). Unpolarized pixels 302 may be capable of reflecting a greater intensity of EUV radiation relative to polarized pixels, which enables the unpolarized pixels 302 to increase the throughput of the exposure tool 104. The arrows of the unpolarized pixels 302 represent the non-specific and non-directional attributes of the unpolarized radiation.

A TE polarized pixel 304 includes a pixel 204 that is configured to reflect TE polarized radiation (e.g., TE polarized EUV radiation). TE polarized radiation refers to electromagnetic radiation (or light) in which the electric field of the electromagnetic radiation is normal (or perpendicular) to the plane of incidence of the electromagnetic radiation, and in which the magnetic field of the electromagnetic radiation is along (or parallel to) the plane of incidence. TE polarized pixels 304 may reflect EUV radiation at a lower intensity relative to an unpolarized pixel 302 because the TE polarized radiation is only one component of unpolarized radiation—the other component being TM polarized radiation. However, TE polarized radiation may increase the contrast of a pattern transferred from the reticle 108 to the semiconductor substrate 110 by the reflected radiation (particularly at higher numerical apertures). The increased contrast is provided by the complete (or near complete) destruction interference of the TE polarized radiation, which results in a final electric vector of 0 at the semiconductor substrate 110. In other words, the TE polarized radiation is brighter (e.g., greater intensity) in the constructive interference of the TE polarized radiation and darker (or completely dark) in the deconstructive interference of the TE polarized radiation.

A TM polarized pixel 306 includes a pixel 204 that is configured to reflect TM polarized radiation (e.g., TM polarized EUV radiation). TM polarized radiation refers to electromagnetic radiation (or light) in which the electric field of the electromagnetic radiation is along (or parallel to) to the plane of incidence of the electromagnetic radiation, and in which the magnetic field of the electromagnetic radiation is normal (or perpendicular) the plane of incidence.

The pixels 204 may be configured in various combinations and/or arrangements of polarization configurations to achieve particular types of polarization patterns for the illumination system 130b. For example, the pixels 204 of the illumination 130b may include a combination of unpolarized pixels 302, TE polarized pixels 304, and TM polarized pixels 306 to achieve a radial polarization pattern or an azimuthal polarization pattern, among other examples. Moreover, in some implementations, one or more of the pixels 204 are configurable in that one or more of the pixels 204 are capable of switching between various polarization configurations, which enables free-form or arbitrary polarization of EUV radiation in the exposure tool 104. In other words, this provides the exposure tool 104 (and the controller 140) with the flexibility to optimize polarization patterns for different exposure operations, different pattern configurations of reticles 108 used in the exposure tool 104. The quantity of unpolarized pixels 302 included on the substrate 206 may be increased to increase the reflectivity of the illumination system 130b and to increase the throughput of the exposure tool 104, or may be decreased to enable a greater quantity of TE polarized pixels 304 and/or a greater quantity of TM polarized pixels 306 to be included on the substrate 206. The quantity of TE polarized pixels 304 may be increased to increase the contrast of the pattern transferred from the reticle 108 to the semiconductor substrate 110, or may be decreased to enable a great quantity of unpolarized pixels 302 and/or a greater quantity of TM polarized pixels 306 to be included on the substrate 206. The quantity of TM polarized pixels 306 may be increased to enable flexibility in configuring particular types of polarization patterns, or may be decreased to enable a great quantity of unpolarized pixels 302 and/or a greater quantity of TE polarized pixels 304 to be included on the substrate 206.

As indicated above, FIG. 3 is provided as an example. Other examples may differ from what is described with regard to FIG. 3.

Figure 4:
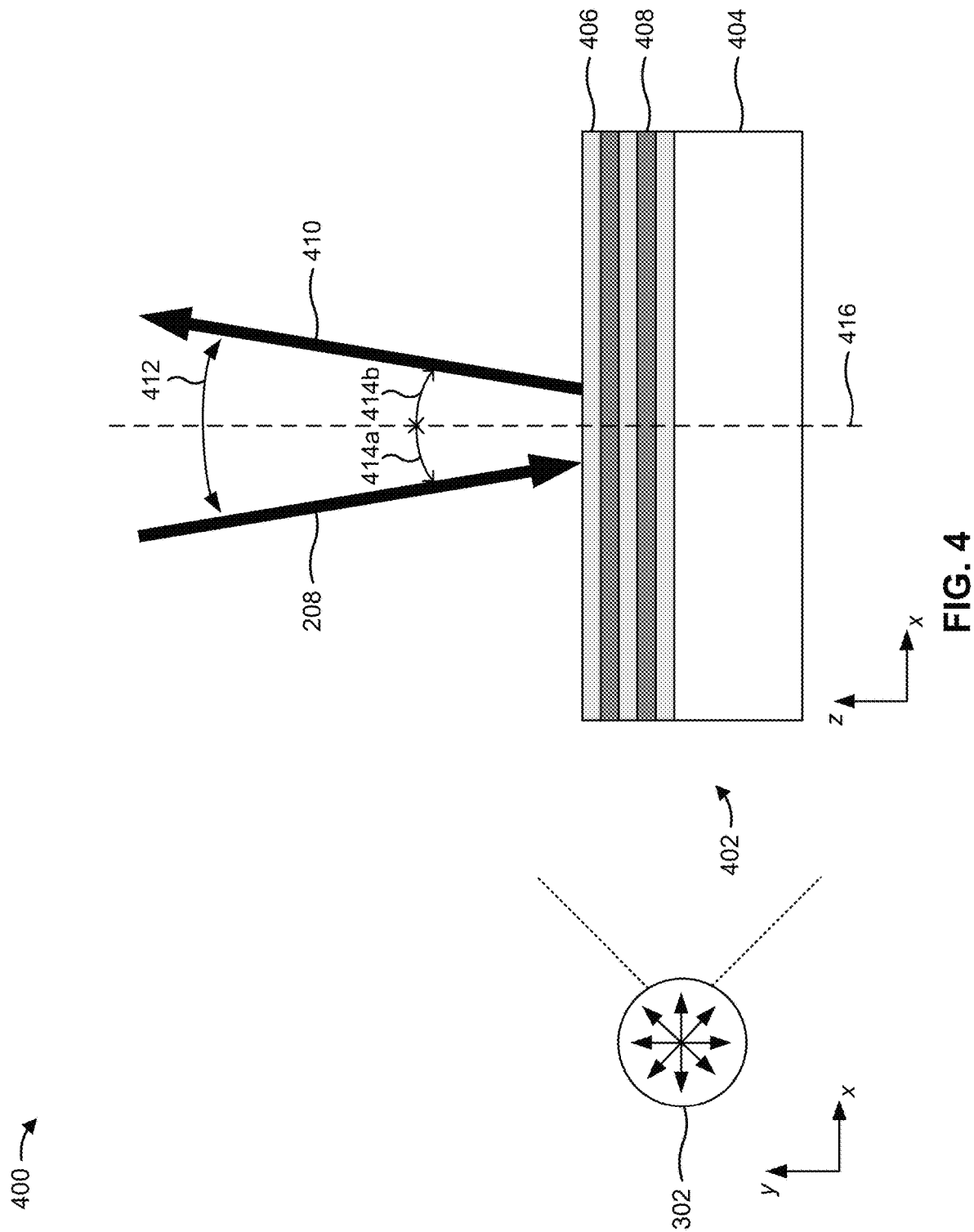
FIGS. 4-6 are diagrams of example implementations of pixel types described herein.

FIG. 4 is a side view diagram of an example implementation 400 of an unpolarized pixel 302 described herein. In particular, the example implementation 400 illustrates the structure of the unpolarized pixel 302 and the operation of the unpolarized pixel 302.

As shown in FIG. 4, the unpolarized pixel 302 includes a multilayer mirror (ML mirror) 402. The multilayer mirror 402 may physically occupy the entire approximate area of the unpolarized pixel 302 or a portion thereof. The multilayer mirror 402 includes a base layer 404 and a plurality of alternating layers over and/or on the base layer 404. The alternating layers include a plurality of layers 406 and a plurality of layers 408, where a layer 406 is included over and/or on the base layer 404, a layer 408 is included over and/or on the layer 406, another layer 406 is included over and/or on the layer 408, another layer 408 is included over and/or on the other layer 406, and so on. In some implementations, the layers 406 and 408 are formed as a coating on the base layer 404. In some implementations, the layers 406 and 408 are formed as a separate structure that is subsequently bonded to the base layer 404.

The layers 406 and 408 include alternating layers of molybdenum and silicon (Mo/Si layers), molybdenum and beryllium (Mo/Be layers), or another combination of layers that have different refractive indices. The combination of the materials in the layers 406 and 408 may be selected to provide a difference in refractive indices between the layers 406 and 408 (e.g., to provide reflectivity at an interface of the layers 406 and 408 according to Fresnel's equations), while reducing and/or minimizing extinction coefficients for the layers 406 and 408 (e.g., to minimize absorption).

In general, the reflectivity of the multilayer mirror 402 may increase as a quantity of pairs of the layers 406 and 408 is increased. In some implementations, the multilayer mirror 402 includes 20 to 40 pairs of the layers 406 and 408, which enables the multilayer mirror 402 to achieve a reflectivity of approximately 60% to approximately 80%. However, other quantities of pairs of the layers 406 and 408 are within the scope of the present disclosure. A thickness of the silicon layers (e.g., the layers 408) may be included in a range of approximately 2 nanometers (nm) to about 6 nm, and a thickness of the molybdenum layers (e.g., the layers 406) may be included in a range of approximately 1 nm to approximately 5 nm to achieve suitable reflectivity and absorption performance. However, other values for the thickness of the layers 406 and 408 are within the scope of the present disclosure.

As further shown in FIG. 4, unpolarized radiation 208 (e.g., unpolarized EUV radiation reflected by the mirror facets 202 from the mirror 130a toward the illumination system 130b) incident upon the multilayer mirror 402 of the unpolarized pixel 302 is reflected as reflected unpolarized radiation (e.g., reflected unpolarized EUV radiation) 410 by the multilayer mirror 402. It is noted that the FIG. 4 illustrates the direction of travel of the unpolarized radiation 208 (e.g., a light path of the unpolarized radiation 208) and a direction of travel of the reflected unpolarized radiation 410 (e.g., a light path of the reflected unpolarized radiation 410). In practice, the unpolarized radiation 208 may illuminate approximately the entire surface area of the multilayer mirror 402, and the reflected unpolarized radiation 410 may be reflected off approximately the entire surface area of the multilayer mirror 402. Moreover, portions of the reflected unpolarized radiation 410 may be reflected off one or more of the layers 406 and/or 408 further down from the top surface of the multilayer mirror 402.

The overall angle 412 between a ray of the unpolarized radiation 208 incident upon the multilayer mirror 402 and a ray of a corresponding reflected unpolarized radiation 410 may be referred to as a chief ray angle (CRA) or as a chief ray angle at object (CRAO). The overall angle 412 may be approximately 8 degrees to approximately 16 degrees or another angle. The overall angle 412 may include the sum of the angle of incidence 414a of the ray of the unpolarized radiation 208 and the angle of reflectance 414b of the ray of the reflected unpolarized radiation 410. The magnitude of the angle of incidence 414a and the magnitude of the angle of reflectance 414b are relative to an axis 416 that is approximately perpendicular to the surface of reflection of the multilayer mirror 402. In some implementations, the magnitude of the angle of incidence 414a and the magnitude of the angle of reflectance 414b are each approximately 4 to approximately 8 degrees. However, other values for the magnitude of the angle of incidence 414a and the magnitude of the angle of reflectance 414b are within the scope of the present disclosure.

Note that TE and TM modes are defined relative to the plane of incidence in all examples in the present disclosure. In FIG. 4, for example, the incident beam 208 comes from left side with incident angle 414a to the axis 416. Therefore, the electric field is in the Y direction for the TE polarized pixel 304. The electric field is in the X direction for the TM polarized pixel 306. The TE and TM mode are different when considering the imaging on a wafer with certain orientation of a particular pattern. For periodic line and space array in the Y direction, the TE mode is the one with electric field in the Y direction, as in the TE polarized pixel 304 in FIG. 3, and the TM mode is with electric field in the X direction, as in the TM polarized pixel 306 in FIG. 3. For periodic line and space array in X direction, the TE mode is with the electric field in the X direction, and the TM mode is with the electric field in the Y direction.

Fig. As indicated above, FIG. 4 is provided as an example. Other examples may differ from what is described with regard to FIG. 4.

5 is a side view diagram of an example implementation 500 of a TE polarized pixel 304 described herein. In particular, the example implementation 500 illustrates the structure of the TE polarized pixel 304 and the operation of the TE polarized pixel 304.

Figure 5:
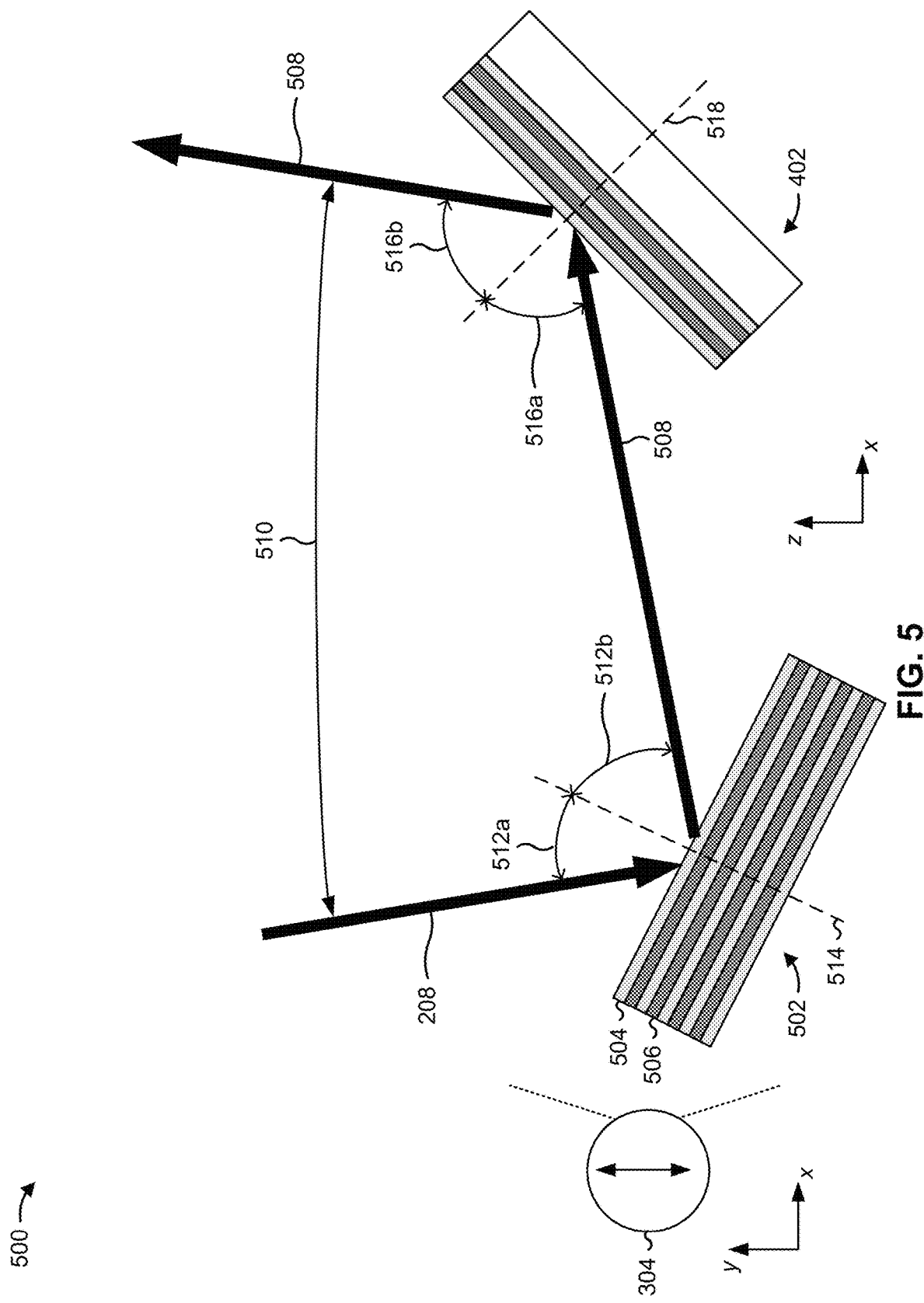

As shown in FIG. 5, the TE polarized pixel 304 includes a multilayer mirror 402 as described above in connection with FIG. 4. Moreover, the TE polarized pixel 304 includes a multilayer polarizer (e.g., an ML polarizer structure) 502. The multilayer polarizer 502 includes a plurality of alternating layers, including a plurality of layers 504 and a plurality of layers 506, where a layer 506 is included over and/or on a layer 504, another layer 504 is included over and/or on the layer 506, another layer 506 is included over and/or on the other layer 504, and so on.

The layers 504 and 506 include alternating layers of molybdenum and silicon (Mo/Si layers), molybdenum and beryllium (Mo/Be layers), or another combination of layers that have different refractive indices. The combination of the materials in the layers 504 and 506 may be selected to provide a difference in refractive indices between the layers 504 and 506 (e.g., to provide reflectivity at an interface of the layers 504 and 506 according to Fresnel's equations), while providing reducing and/or minimizing extinction coefficients for the layers 504 and 506 (e.g., to minimize absorption). The quantity of pairs including a layer 504 and a layer 506 may be included in a range of 18 pairs to 22 pairs to provide sufficient reflectivity and sufficient polarization. However, other values for the quantity of the pairs are within the scope of the present disclosure.

The thickness of a layer 504 and the thickness of a layer 506 may be different to achieve polarization of the unpolarized radiation 208 incident upon the multilayer polarizer 502. In particular, the difference in the respective thicknesses of the layers 504 and the layers 506 facilitate the separation of the unpolarized radiation 208 into reflected TE polarized radiation 508 and transmitted TM polarized radiation. In particular, the reflected TE polarized radiation 508 is reflected off of the multilayer polarizer 502 and toward the multilayer mirror 402, whereas the transmitted TM polarized radiation is transmitted through the multilayer polarizer 502 (e.g., and is not reflected by the TE polarized pixel 304). In some implementations, the thickness of the layers 504 (e.g., which may include molybdenum layers) are included in a range of approximately 2.2 nm to approximately 2.8 nm, whereas the thickness of the layers 506 (e.g., which may include silicon layers) are included in a range of approximately 6.7 nm to approximately 7.3 nm to achieve a sufficient reflectance degree of polarization (DOP) and to achieve a sufficient transmittance degree of polarization. However, other values for the thicknesses of the layers 504 and 506 are within the scope of the present disclosure.

As further shown in FIG. 5, the unpolarized radiation 208 incident upon the multilayer polarizer 502 of the TE polarized pixel 304 is reflected as reflected TE polarized radiation (e.g., reflected TE polarized EUV radiation) 508 by the multilayer polarizer 502 toward the multilayer mirror 402. It is noted that the FIG. 5 illustrates the direction of travel of the unpolarized radiation 208 (e.g., a light path of the unpolarized radiation 208) and a direction of travel of the reflected TE polarized radiation 508 (e.g., a light path of the reflected TE polarized radiation 508). In practice, the unpolarized radiation 208 may illuminate approximately the entire surface area of the multilayer polarizer 502, and the reflected TE polarized radiation 508 may be reflected onto approximately the entire surface area of the multilayer mirror 402 (or a portion thereof). Moreover, portions of the reflected TE polarized radiation 508 may be reflected off of one or more of the layers 504 and/or 506 further down from the top surface of the multilayer polarizer 502, and may be reflected off of one or more of the layers 406 and/or 408 further down from the top surface of the multilayer mirror 402.

The overall angle 510 between a ray of the unpolarized radiation 208 incident upon the multilayer polarizer 502 and a ray of a corresponding reflected TE polarized radiation 508 may be approximately 8 degrees to approximately 16 degrees or another angle. The magnitude of the angle of incidence 512a of the unpolarized radiation 208 toward the multilayer polarizer 502 relative to an axis 514 that is approximately perpendicular to the surface of reflection of the multilayer polarizer 502, and the magnitude of the angle of reflectance 512b of the reflected TE polarized radiation 508 reflected off of the multilayer polarizer 502, may each be included in a range of approximately 40 degrees to approximately 44 degrees to achieve a high reflectance degree of polarization (e.g., approximately 99% reflectance degree of polarization or greater). However, other values for the magnitude of the angle of incidence 512a and the magnitude of the angle of reflectance 512b are within the scope of the present disclosure.

The magnitude of the angle of incidence 516a of the reflected TE polarized radiation 508 incident upon the multilayer mirror 402 relative to an axis 518 that is approximately perpendicular to the surface of reflection of the multilayer mirror 402, and the magnitude of the angle of reflectance 516b of the reflected TE polarized radiation 508 reflected off of the multilayer mirror 402, may each be included in a range of approximately 52 degrees to approximately 56 degrees to achieve a particular chief ray angle (e.g., the overall angle 510) for the TE polarized pixel 304. However, other values for the magnitude of the angle of incidence 512a and the magnitude of the angle of reflectance 512b are within the scope of the present disclosure. The chief ray angle may include the difference between the angle of reflectance 516b and the angle of incidence 512a. As an example, the chief ray angle may be approximately 12 degrees for a 42 degree angle of incidence 512a and a 54 degree angle of reflectance 516b. However, other values for the chief ray angle of the TE polarized pixel 304 are within the scope of the present disclosure.

In some implementations, a combination of the parameters described above for the multilayer polarizer 502, such as the quantity of alternating pairs of the layers 504 and 506, the differences in thicknesses between the layers 504 and 506, and the angle of incidence 512a of the unpolarized radiation 208 toward the multilayer polarizer 502 may be configured to achieve or provide particular performance parameters for multilayer polarizer 502. For example, a combination of the parameters for the multilayer polarizer 502 may be configured in one or more of the ranges described above (and/or other ranges) to achieve a reflectivity of TM polarized radiation of approximately 0.01% or less and a reflectivity of the TE polarized radiation of approximately 34% or greater. As another example, a combination of the parameters for the multilayer polarizer 502 may be configured in one or more of the ranges described above (and/or other ranges) to achieve a reflectance degree of polarization of approximately 99% or greater.

As further shown in FIG. 5, the multilayer polarizer 502 may be positioned lower than the multilayer mirror 402 in the TE polarized pixel 304. For example, the highest edge (or corner) of the multilayer polarizer 502 may be lower than the highest edge (or corner) of the multilayer mirror 402, and/or the lowest edge (or corner) of the multilayer polarizer 502 may be lower than the lowest edge (or corner) of the multilayer mirror 402. The lower relative position of the multilayer polarizer 502 enables the angle of incidence 512a to be configured to achieve a high reflectance degree of polarization while enabling the angle of reflectance 516b to be configured to achieve a particular chief ray angle for the TE polarized pixel 304.

As indicated above, FIG. 5 is provided as an example. Other examples may differ from what is described with regard to FIG. 5.

Figure 6:
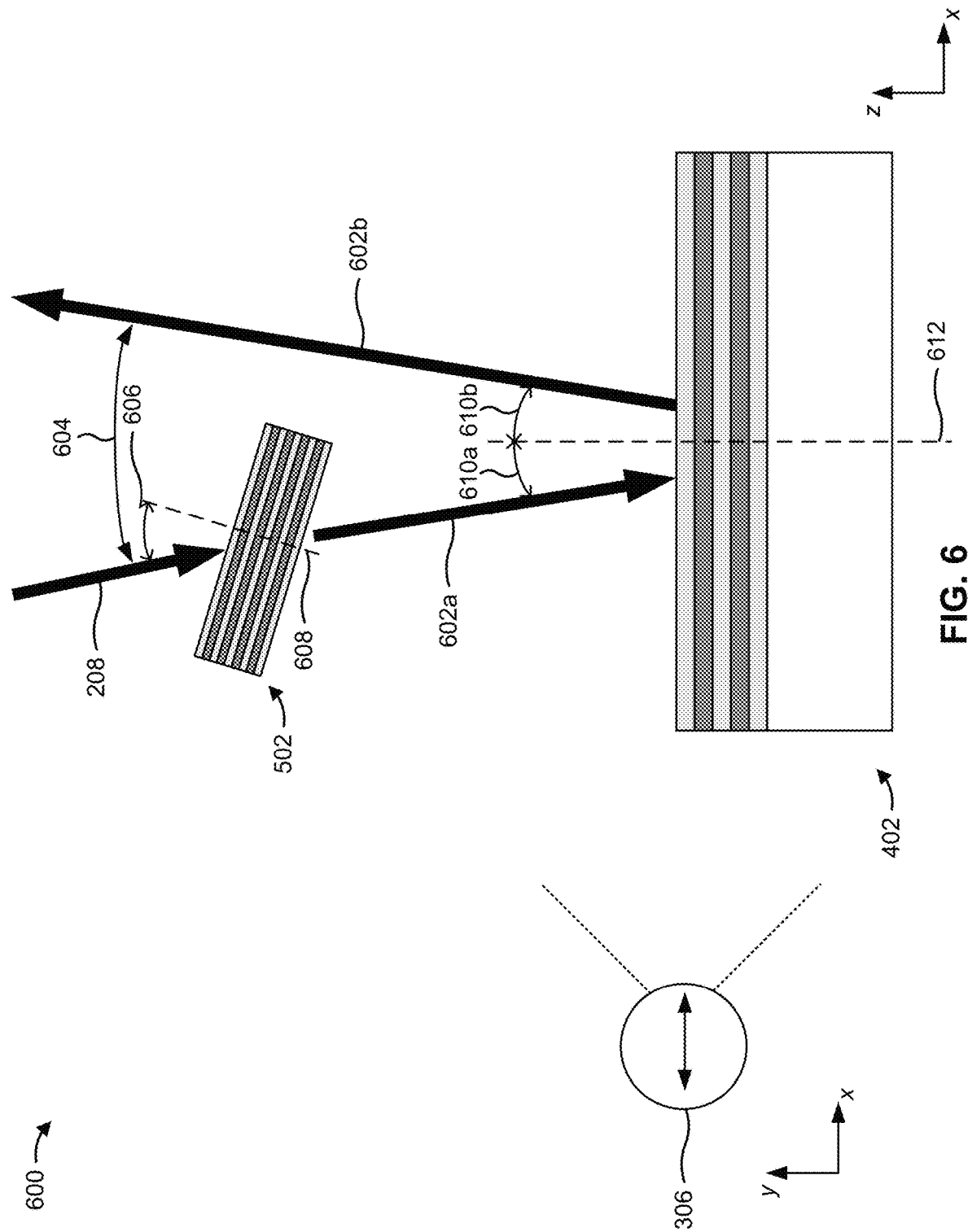

FIG. 6 is a diagram of an example implementation 600 of a TM polarized pixel 306 described herein. In particular, the example implementation 600 illustrates the structure of the TM polarized pixel 306 and the operation of the TM polarized pixel 306.

As shown in FIG. 6, the TM polarized pixel 306 includes a multilayer mirror 402 as described above in connection with FIG. 4. Moreover, the TM polarized pixel 306 includes a multilayer polarizer 502 as described above in connection with FIG. 5.

As further shown in FIG. 6, the multilayer polarizer 502 separates and/or extracts TM polarized radiation from unpolarized radiation 208 incident upon the multilayer polarizer 502. In other words, the multilayer structure of the multilayer polarizer 502 separates the unpolarized radiation 208 into TE polarized radiation (not shown) and the TM polarized radiation, which passes through the multilayer polarizer 502 and is transmitted toward the multilayer mirror 402 as transmitted TM polarized radiation 602a. The multilayer mirror 402 is positioned below and/or under the multilayer polarizer 502 to receive the transmitted TM polarized radiation 602a. The multilayer mirror 402 reflects the transmitted TM polarized radiation 602a as reflected TM polarized radiation 602b.

It is noted that the FIG. 6 illustrates the direction of travel of the unpolarized radiation 208 (e.g., a light path of the unpolarized radiation 208), a direction of travel of the transmitted TM polarized radiation 602a (e.g., a light path of the transmitted TM polarized radiation 602a), and a direction of travel of the reflected TM polarized radiation 602b (e.g., a light path of the reflected TM polarized radiation 602b). In practice, the unpolarized radiation 208 may illuminate approximately the entire surface area of the multilayer polarizer 502, and the transmitted TM polarized radiation 602a may be transmitted onto approximately the entire surface area of the multilayer mirror 402 (or a portion thereof). Moreover, portions of the reflected TM polarized radiation 602b may be reflected off one or more of the layers 406 and/or 408 further down from the top surface of the multilayer mirror 402.

The overall angle 604 between a ray of the unpolarized radiation 208 incident upon the multilayer polarizer 502 and a ray of a corresponding reflected TM polarized radiation 602b may be approximately 8 degrees to approximately 16 degrees or another angle. The magnitude of the angle of incidence 606 of the unpolarized radiation 208 toward the multilayer polarizer 502 relative to an axis 608 that is approximately perpendicular to the surface of reflection of the multilayer polarizer 502 may be included in a range of approximately 40 degrees to approximately 44 degrees to achieve a high transmission degree of polarization (e.g., approximately 85% transmittance degree of polarization or greater) and to achieve a high degree of transmittance (e.g., approximately 25% or greater). However, other values for the magnitude of the angle of incidence 606 are within the scope of the present disclosure.

The magnitude of the angle of incidence 610a of the transmitted TM polarized radiation 602a and the magnitude of the angle of reflectance 610b of the reflected TM polarized radiation 602b are relative to an axis 612 that is approximately perpendicular to the surface of reflection of the multilayer mirror 402. In some implementations, the magnitude of the angle of incidence 610a and the magnitude of the angle of reflectance 610b are each approximately 4 to approximately 8 degrees. However, other values for the magnitude of the angle of incidence 610a and the magnitude of the angle of reflectance 610b are within the scope of the present disclosure.

In some implementations, a combination of the parameters described above for the multilayer polarizer 502, such as the quantity of alternating pairs of the layers 504 and 506, the differences in thicknesses between the layers 504 and 506, and the angle of incidence 606 of the unpolarized radiation 208 toward the multilayer polarizer 502 may be configured to achieve or provide particular performance parameters for multilayer polarizer 502. For example, a combination of the parameters for the multilayer polarizer 502 may be configured in one or more of the ranges described above (and/or other ranges) to achieve a reflectivity of TM polarized radiation of approximately 23% or greater and a transmittance of the TM polarized radiation of approximately 2% or less. As another example, a combination of the parameters for the multilayer polarizer 502 may be configured in one or more of the ranges described above (and/or other ranges) to achieve a transmittance degree of polarization of approximately 85% or greater.

As indicated above, FIG. 6 is provided as an example. Other examples may differ from what is described with regard to FIG. 6.

Figure 7:
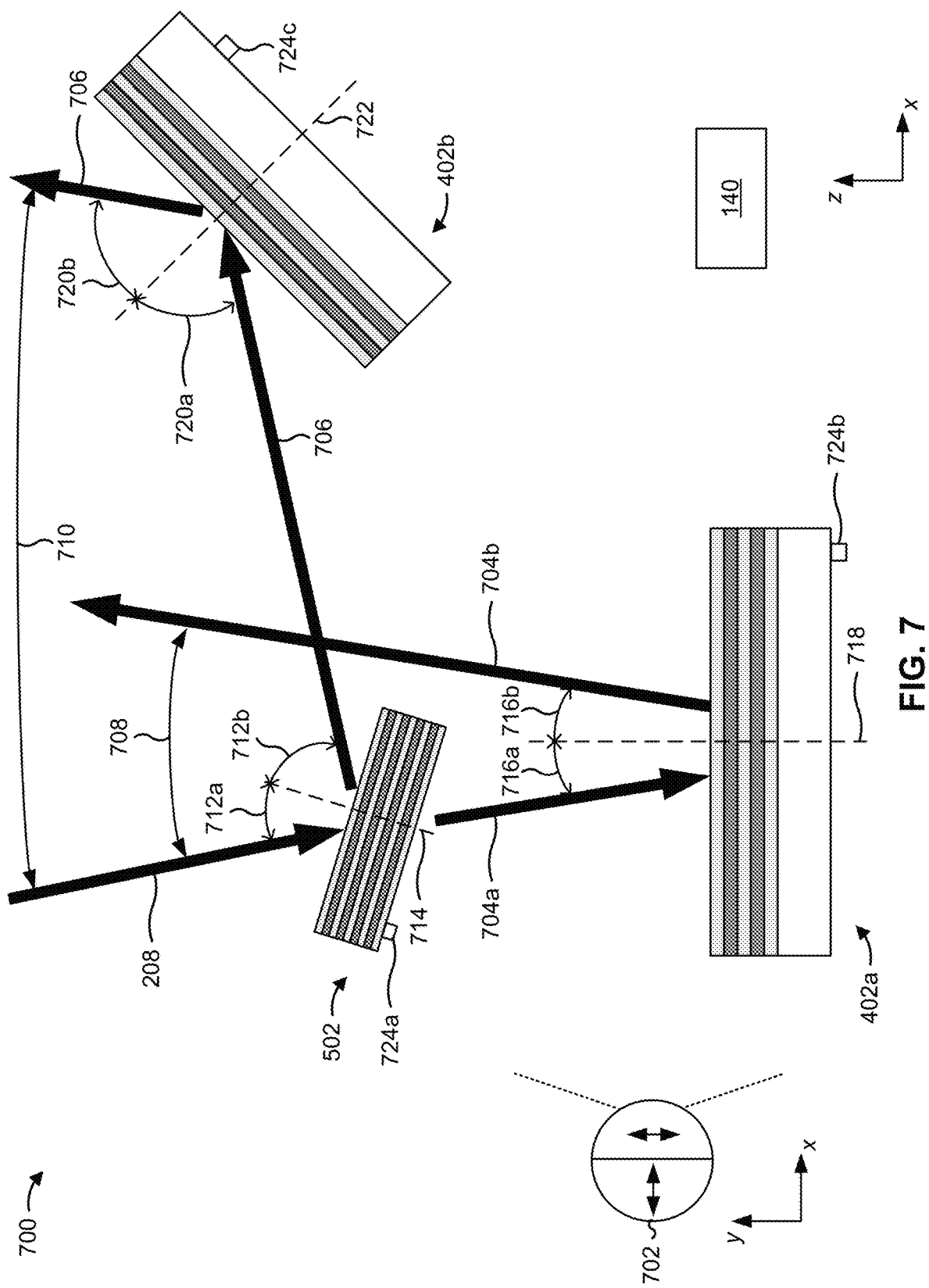

FIG. 7 is a diagram of an example implementation 700 of a configurable pixel 702 described herein. The example pixel configurations described above in connection with FIGS. 4-6 may be referred to as fixed pixel configurations in that a pixel 204 is configured in one of the pixel configurations described above in connection with FIGS. 4-6 and is not changed. As an example, a pixel 204 may be configured as an unpolarized pixel 302 as illustrated and described above in connection with FIG. 4, where the configuration of the pixel 204 does not change from the configuration as an unpolarized pixel 302. As another example, a pixel 204 may be configured as a TE polarized pixel 304 as illustrated and described above in connection with FIG. 5, where the configuration of the pixel 204 does not change from the configuration as a TE polarized pixel 304. As another example, a pixel 204 may be configured as a TM polarized pixel 306 as illustrated and described above in connection with FIG. 6, where the configuration of the pixel 204 does not change from the configuration as a TM polarized pixel 306. The configurable pixel 702 illustrated in FIG. 7 is configurable in that the polarization configuration of the configurable pixel 702 is capable of being selectively changed to different polarization configurations, as described herein. The capability to change polarization configuration for configurable pixels 702 on the illumination system 130b enables free-form polarization for the exposure tool 104. Moreover, the configurable pixel 702 is capable of reflecting separated types of polarized radiation (e.g., at the same time), including TE polarized radiation and TM polarized radiation.

The configurable pixel 702 (or a plurality of configurable pixels 702) may be included on the substrate 206 of the illumination system 130b (e.g., as pixel(s) 204). In some implementations, the illumination system 130b includes all configurable pixels 702, which increases the flexibility of the illumination system 130b to provide free-form polarization. In some implementations, the illumination system 130b includes a combination of configurable pixels 702 and fixed pixels (e.g., pixels 204 that are each fixed in one of the polarization configurations illustrated in FIGS. 4-6) to provide a degree of free-form polarization while reducing the manufacturing complexity of the illumination system 130b.

As shown in FIG. 7, the configurable pixel 702 includes a multilayer polarizer 502 and a plurality of multilayer mirrors 402, including a multilayer mirror 402a under and/or below the multilayer polarizer 502 and another multilayer mirror 402b adjacent to the multilayer polarizer 502. The multilayer polarizer 502 may receive unpolarized radiation 208, may separate the unpolarized radiation 208 (e.g., using the plurality of pairs of alternating layers 504 and 506) into transmitted TM polarized radiation 704a and reflected TE polarized radiation 706. The transmitted TM polarized radiation 704a is reflected off the multilayer mirror 402a, which provides reflected TM polarized radiation 704b. The reflected TE polarized radiation 706 is reflected off the multilayer mirror 402b, which reflects the TE polarized radiation 706. In the example implementation 700 illustrated in FIG. 7, the configurable pixel 702 is configured in a polarization configuration in which the configurable pixel 702 reflects the reflected TM polarized radiation 704a in a first portion of the configurable pixel 702 and reflects the reflected TE polarized radiation 706 in a second (adjacent) portion of the configurable pixel 702.

The overall angle 708 may correspond to the overall angle 604. The overall angle 710 may correspond to the overall angle 510. The angle of incidence 712a relative to the axis 714 may correspond to the angle of incidence 512a and/or the angle of incidence 606. The angle of reflectance 712b relative to the axis 714 may correspond to the angle of reflectance 512b. The angle of incidence 716a relative to the axis 718 may correspond to the angle of incidence 414a and/or the angle of incidence 610a. The angle of reflectance 716b relative to the axis 718 may correspond to the angle of reflectance 414b and/or the angle of reflectance 610b. The angle of incidence 720a relative to the axis 722 may correspond to the angle of incidence 516a. The angle of reflectance 720b relative to the axis 722 may correspond to the angle of reflectance 516b.

As further shown in FIG. 7, the multilayer polarizer 502, the multilayer mirror 402a, and the multilayer mirror 402b may each include a respective actuator such that the multilayer polarizer 502, the multilayer mirror 402a, and the multilayer mirror 402b may be independently actuated to change the polarization configuration of the configurable pixel 702. For example, the multilayer polarizer 502 includes an actuator 724a, the multilayer mirror 402a includes an actuator 724b, and the multilayer mirror 402b includes an actuator 724c. The actuators 724a-724c may include a servo-controlled motor, a direct current (DC) brushed or brushless motor, a linear motor, a stepper motor, and/or another type of actuator that is capable of rotating, translating, and/or displacing the multilayer polarizer 502, the multilayer mirror 402a, and/or the multilayer mirror 402b.

The controller 140 may communicate with the actuators 724a-724c to receive sensor data associated with the multilayer polarizer 502, the multilayer mirror 402a, and/or the multilayer mirror 402b. The sensor data may include or may indicate, for example, position information associated with the multilayer polarizer 502, the multilayer mirror 402a, and/or the multilayer mirror 402b, rotational velocity and/or linear velocity of the multilayer polarizer 502, the multilayer mirror 402a, and/or the multilayer mirror 402b, and/or other types of sensor data. The controller 140 is further configured to communicate with the actuators 724a-724c to provide one or more signals to the actuators 724a-724c to selectively configure the configurable pixel 702 in various polarization configurations described herein. The signal(s) may include analog signals (e.g., a voltage, a current), digital signals (e.g., digital communications), and/or other types of signals that are transmitted over a wired and/or wireless connection to the actuators 724a-724c. The controller 140 may provide or transmit a signal to the actuator 724a to cause the actuator 724a to actuate the multilayer polarizer 502 to cause the configurable pixel 702 to be configured in a particular polarization configuration. The controller 140 may provide or transmit a signal to the actuator 724b to cause the actuator 724b to actuate the multilayer mirror 402a to cause the configurable pixel 702 to be configured in a particular polarization configuration. The controller 140 may provide or transmit a signal to the actuator 724c to cause the actuator 724c to actuate the multilayer mirror 402b to cause the configurable pixel 702 to be configured in a particular polarization configuration.

In some implementations, the controller 140 provides or transmits signals to one or more actuators of a plurality of configurable pixels 702 included on the illumination system 130b to cause the illumination system 130b to be configured in a particular polarization pattern or to enable free-form polarization. In some implementations, the controller 140 provides or transmits signals to one or more actuators of a plurality of configurable pixels 702 to cause subsets of the plurality of configurable pixels 702 to be configured in respective pixel configurations. For example, the controller 140 may provide or transmit a first signal (or a first set of signals) to cause a first subset of configurable pixels 702 to be configured in a TE polarized configuration (e.g., as illustrated and described in connection with FIG. 8B), may provide or transmit a second signal (or a second set of signals) to cause a second subset of configurable pixels 702 to be configured in a TM polarized configuration (e.g., as illustrated and described in connection with FIG. 8C), and may provide or transmit a third signal (or a third set of signals) to cause a third subset of configurable pixels 702 to be configured in an unpolarized configuration (e.g., as illustrated and described in connection with FIG. 8A). Additionally and/or alternatively, the controller 140 may provide or transmit a signal (or a set of signals) to cause a subset of configurable pixels 702 to be configured in the TE polarized and TM polarized configuration illustrated in FIG. 7. In some implementations, the controller 140 provides or transmits a signal (or a set of signals) to cause a subset of configurable pixels 702 to be configured in an off configuration (e.g., as illustrated and described in connection with FIG. 8D) such that the subset of configurable pixels 702 is deactivated (e.g., does not reflect incident light).

In some implementations, the controller 140 determines the polarization pattern for the illumination system 130b (or determines the specific combination of polarization configurations for the plurality of configurable pixels 702) based on one or more parameters. The one or more parameters may be associated with an exposure operation of the semiconductor substrate 110 or may be associated with a substrate lot including a plurality of semiconductor substrates 110 that are to be processed in similar exposure operations. The one or more parameters may include, for example, the pattern of the reticle 108 that is to be transferred to the semiconductor substrate 110 (or the substrate lot), a contrast parameter for the exposure operation, a throughput parameter for the exposure operation, and/or other parameters.

In some implementations, the controller 140 determines the polarization pattern for the illumination system 130b (or determines the specific combination of polarization configurations for the plurality of configurable pixels 702) using a machine learning model. The machine learning model may be trained on training data, which may include the specific combinations of polarization configurations for the plurality of configurable pixels 702 from a plurality of historical exposure operations (e.g., thousands of historical exposure operations or more), the throughput and/or contrast achieved for the historical exposure operations, the types of reticles 108 used for the historical exposure operations, and/or other types of parameters for the historical exposure operations. In some implementations, the controller 140 provides the desired outcomes for an exposure operation (e.g., the contrast parameter, the throughput parameters) along with the pattern of the reticle 108 that is to be used in the exposure operation, and the controller 140 uses the machine learning model to analyze combinations of polarization configurations for the plurality of configurable pixels 702 based on the training data to identify a specific combination of polarization configurations for the plurality of configurable pixels 702 that are estimated to achieve the desired outcomes for the exposure operation. In some implementations, the controller 140 provides a candidate combination of polarization configurations for the plurality of configurable pixels 702 for an exposure operation along with the pattern of the reticle 108 that is to be used in the exposure operation, and the controller 140 uses the machine learning model to generate a likelihood or confidence that the candidate combination of polarization configurations for the plurality of configurable pixels 702 will achieve the desired outcomes for an exposure operation (e.g., the contrast parameter, the throughput parameters).

In some implementations, the controller 140 determines the polarization configurations for the plurality of configurable pixels 702 prior to an exposure operation and transmits signals to cause the plurality of configurable pixels 702 to be configured in the polarization configurations prior to the exposure operation. Alternatively, or after the start of the exposure operation, the controller 140 may determine modified polarization configurations for one or more of the plurality of configurable pixels 702 during the exposure operation and transmit signals to cause the one or more configurable pixels 702 to be configured in the polarization configurations during the exposure operation. This "on-the-fly" polarization adjustment may enable the controller 140 to fine-tune and/or improve patterning performance during the exposure operation.

As indicated above, FIG. 7 is provided as an example. Other examples may differ from what is described with regard to FIG. 7.

Figure 8B:
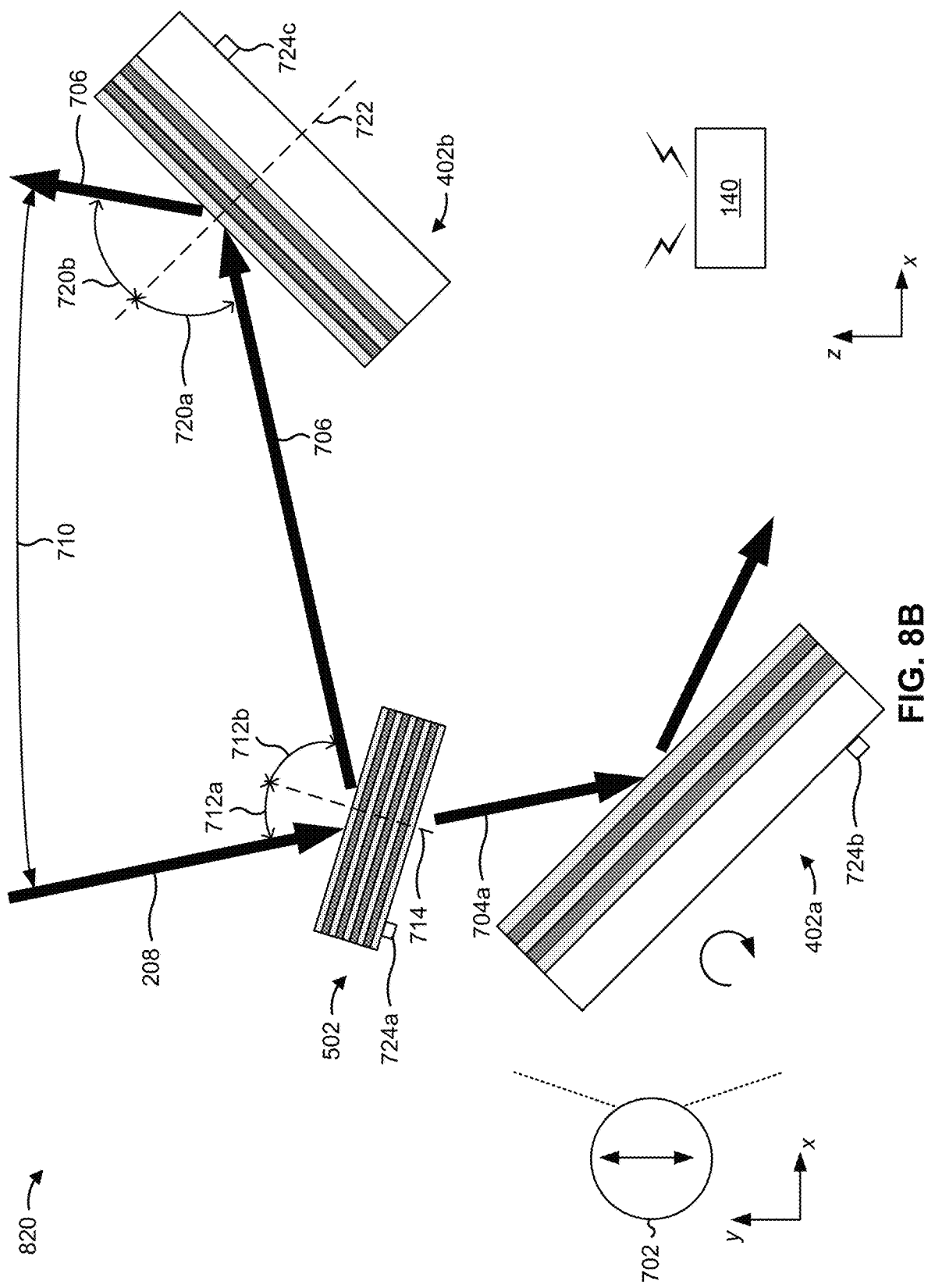

FIGS. 8A-8D are diagrams of example implementations of configurable pixels 702 described herein. FIG. 8A illustrates an example implementation 810 in which a configurable pixel 702 is configured in an unpolarized configuration. As shown in FIG. 8A, the controller 140 transmits one or more signals to the actuator 724a to cause the actuator 724a to actuate the multilayer polarizer 502. The actuation may include rotating the multilayer polarizer 502 as shown in FIG. 8A, translating the multilayer polarizer 502, and/or displacing the multilayer polarizer 502. The actuator 724a may actuate the multilayer polarizer 502 to move the multilayer polarizer 502 out of the light path of the unpolarized radiation 208 incident upon the multilayer polarizer 502. As a result, the unpolarized radiation 208 instead is incident upon the multilayer mirror 402a, which reflects the unpolarized radiation 208. In this way, the multilayer polarizer 502 is moved out of the light path of the unpolarized radiation 208 such that the unpolarized radiation 208 remains unpolarized (e.g., the unpolarized radiation 208 is not split into TE polarized radiation and TM polarized radiation components). In some implementations, the controller 140 transmits another signal (or signals) to the multilayer mirror 402a to cause the actuator 724b to actuate the multilayer mirror 402a to position the multilayer mirror 402a to reflect the unpolarized radiation 208.

FIG. 8B illustrates an example implementation 820 in which a configurable pixel 702 is configured in a TE polarized configuration. As shown in FIG. 8B, the controller 140 transmits one or more signals to the actuator 724b to cause the actuator 724b to actuate the multilayer mirror 402a. The actuation may include rotating the multilayer mirror 402a as shown in FIG. 8B, translating the multilayer mirror 402a, and/or displacing the multilayer mirror 402a. The actuator 724b may actuate the multilayer mirror 402a to angle the multilayer mirror 402a such that the multilayer mirror 402a directs the transmitted TM polarized radiation 704a in a direction so as to refrain from providing the reflected TM polarized radiation 704b. In this way, only the reflected TE polarized radiation 706 is provided by the configurable pixel 702 in the TE polarized configuration of the example implementation 820. In some implementations, the controller 140 transmits another signal (or signals) to the multilayer polarizer 502 and/or to the multilayer mirror 402b to cause the multilayer polarizer 502 and/or to the multilayer mirror 402b to reflect the reflected TE polarized radiation 706.

Figure 8C:
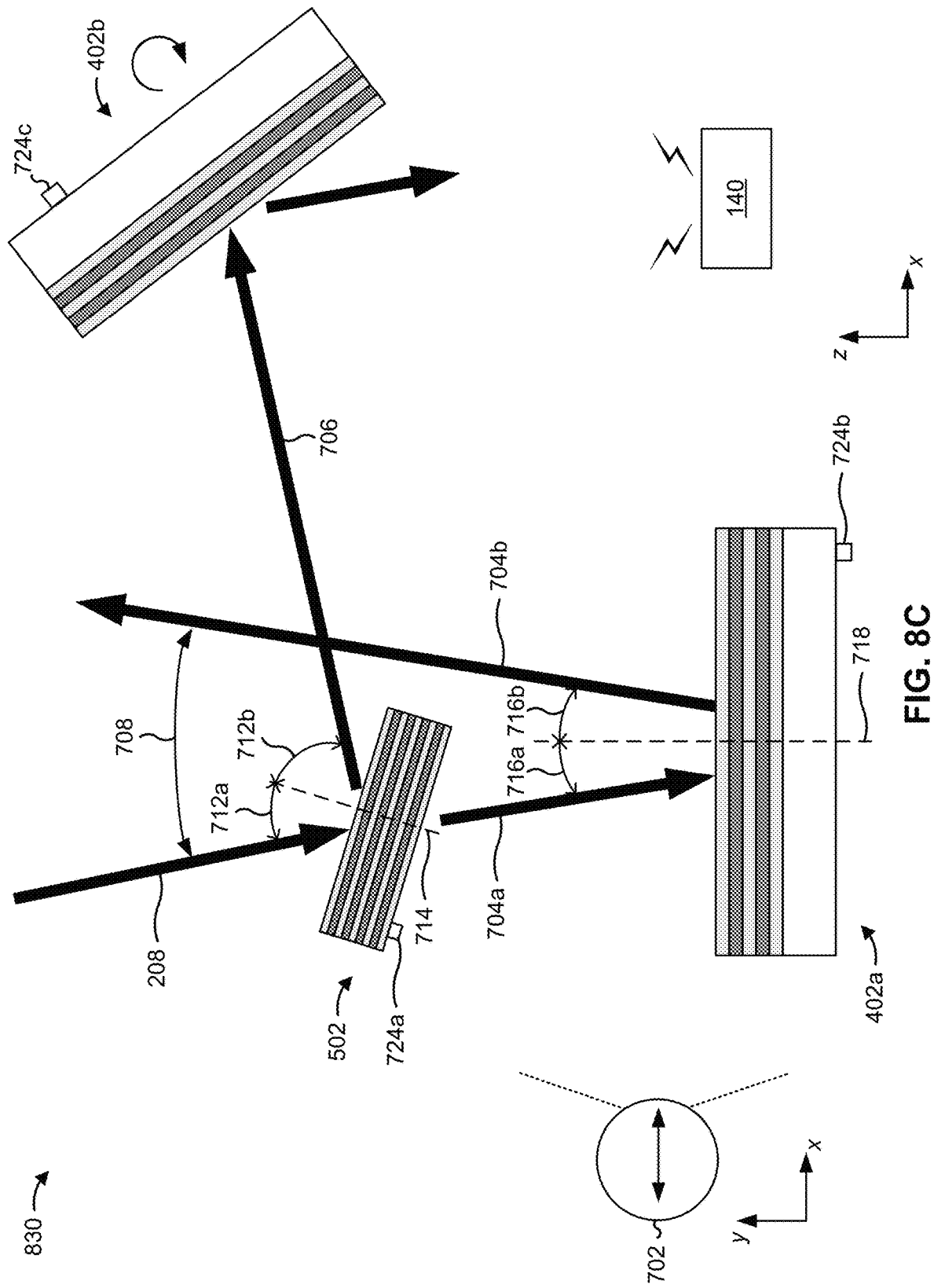

FIG. 8C illustrates an example implementation 830 in which a configurable pixel 702 is configured in a TM polarized configuration. As shown in FIG. 8C, the controller 140 transmits one or more signals to the actuator 724c to cause the actuator 724c to actuate the multilayer mirror 402b. The actuation may include rotating the multilayer mirror 402b as shown in FIG. 8C, translating the multilayer mirror 402b, and/or displacing the multilayer mirror 402b. The actuator 724c may actuate the multilayer mirror 402b to angle the multilayer mirror 402b such that the multilayer mirror 402b directs the reflected TE polarized radiation 706 in a direction so as to refrain from providing the reflected TE polarized radiation 706. In this way, only the reflected TM polarized radiation 704b is provided by the configurable pixel 702 in the TM polarized configuration of the example implementation 830. In some implementations, the controller 140 transmits another signal (or signals) to the multilayer polarizer 502 and/or to the multilayer mirror 402a to cause the multilayer polarizer 502 and/or to the multilayer mirror 402a to reflect the reflected TM polarized radiation 704b.

FIG. 8D illustrates an example implementation 840 in which a configurable pixel 702 is configured in a deactivated configuration. In the deactivated configuration, the configurable pixel 702 refrains from providing radiation output. As shown in FIG. 8D, the controller 140 transmits one or more signals to the actuator 724a to cause the actuator 724a to actuate the multilayer polarizer 502. This causes the actuator 724a to move the multilayer polarizer 502 out of the light path of the unpolarized radiation 208 incident upon the multilayer polarizer 502. Moreover, the controller 140 transmits one or more signals to the actuator 724b to cause the actuator 724b to actuate the multilayer mirror 402a. This causes the actuator 724b to move the multilayer mirror 402a such that the multilayer mirror 402a is configured at an angle in which the multilayer mirror 402a directs the unpolarized radiation 208 such that no output of the configurable pixel 702 is provided.

As indicated above, FIGS. 8A-8D are provided as examples. Other examples may differ from what is described with regard to FIGS. 8A-8D.

Figure 9:
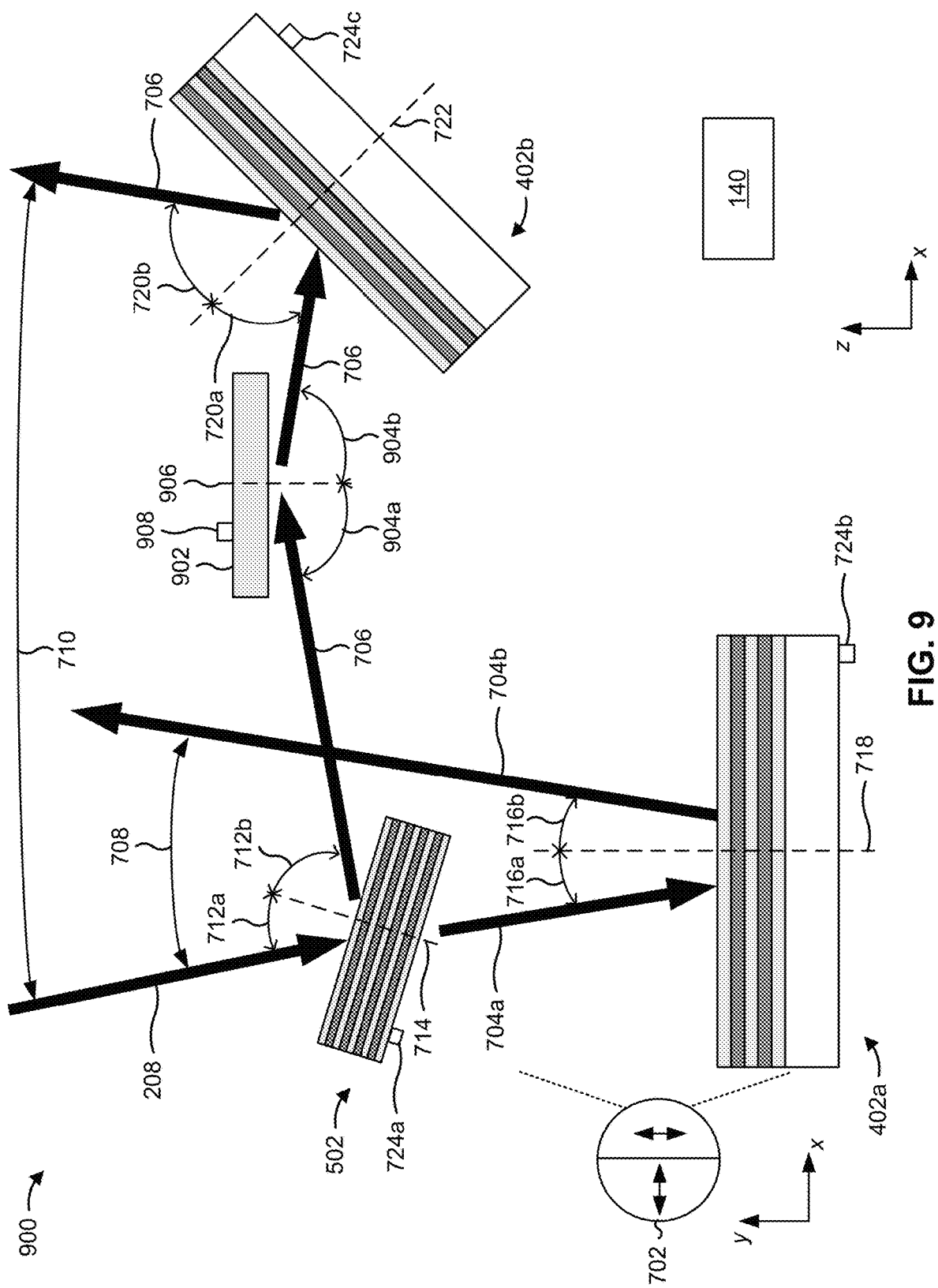

FIG. 9 is a diagram of an example implementation 900 of a configurable pixel 702 described herein. The example implementation 900 of a configurable pixel 702 is similar to the example implementation 700 of a configurable pixel 702 described above in connection with FIG. 7. In addition, the configurable pixel 702 in the example implementation 900 includes a mirror 902 that is positioned in the light path of the reflected TE polarized radiation 706 between the multilayer polarizer 502 and the multilayer mirror 402b. The mirror 902 includes a tunable mirror, a single layer mirror, a multilayer mirror, a mirror including a coating formed on a substrate, or another type of mirror. The mirror 902 enables multilayer mirror 402b to be positioned further away from the multilayer polarizer 502, which in turn enables the reflected TE polarized radiation 706 to be provided to different locations (e.g., further locations than without the use of the mirror 902) on the reticle 108. Moreover, while the multilayer mirror 402b is illustrated in the example implementation 900 as being included in the configurable pixel 702, in other implementations, the mirror 902 may be configured to provide the reflected TE polarized radiation 706 to a multilayer mirror 402 included in another pixel 204. In this way, radiation from a plurality of pixels 204 can be combined to further increase the polarization flexibility of the illumination system 130b.

The magnitude of the angle of incidence 904a of the TE polarized radiation 706 toward the multilayer mirror 402b relative to an axis 906 that is approximately perpendicular to the surface of reflection of the mirror 902, and the magnitude of the angle of reflectance 904b of the reflected TE polarized radiation 706 reflected off of the mirror 902, may each be included in a range of approximately 75 degrees to approximately 81 degrees to achieve a particular angle for the angle of incidence 720a toward the multilayer mirror 402b and/or to achieve a particular chief ray angle for the configurable pixel 702. However, other values for the angle of incidence 904a and for the angle of reflectance 904b are within the scope of the present disclosure.

As further shown in FIG. 9, an actuator 908 may be included on the mirror 902 such that the mirror 902 may be actuated in addition to (or alternatively to) the multilayer polarizer 502, the multilayer mirror 402a, and/or the multilayer mirror 402b. The controller 140 may communicate with the actuator 908 to cause the actuator 908 to actuate the mirror 902 to change or modify the polarization of the configurable pixel 702. Moreover, the controller 140 may communicate with the actuator 908 to cause the actuator 908 to actuate the mirror 902 such that the mirror 902 provides the reflected TE polarized radiation 706 to a multilayer mirror 402 in a particular pixel 204 of the illumination system 130b. In this way, the mirror 902 may be actuated to selectively direct the reflected TE polarized radiation 706 to different pixels 204, which further increases the polarization flexibility of the illumination system 130b.

As indicated above, FIG. 9 is provided as an example. Other examples may differ from what is described with regard to FIG. 9.

Figure 10A:
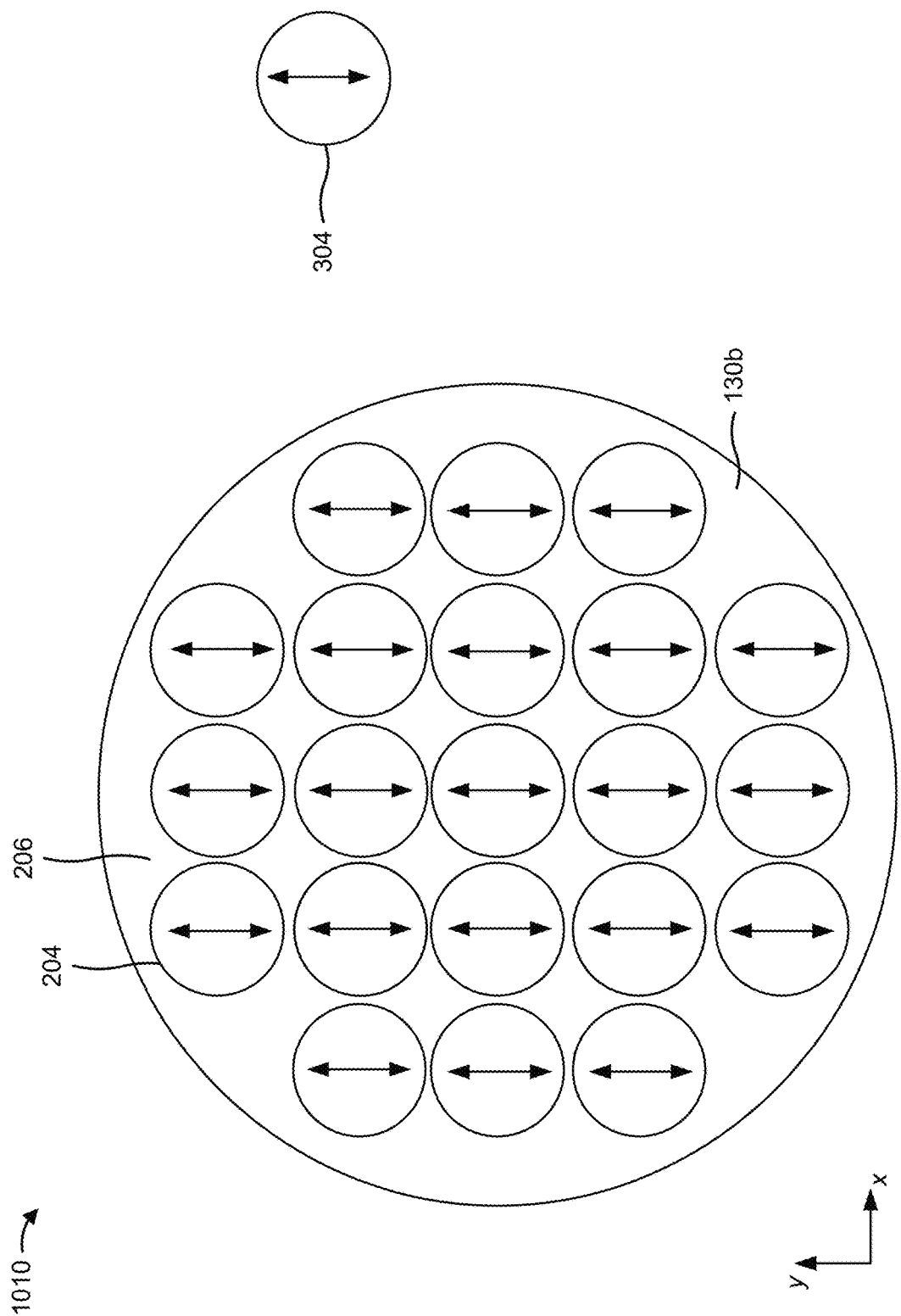
Figure 10B:
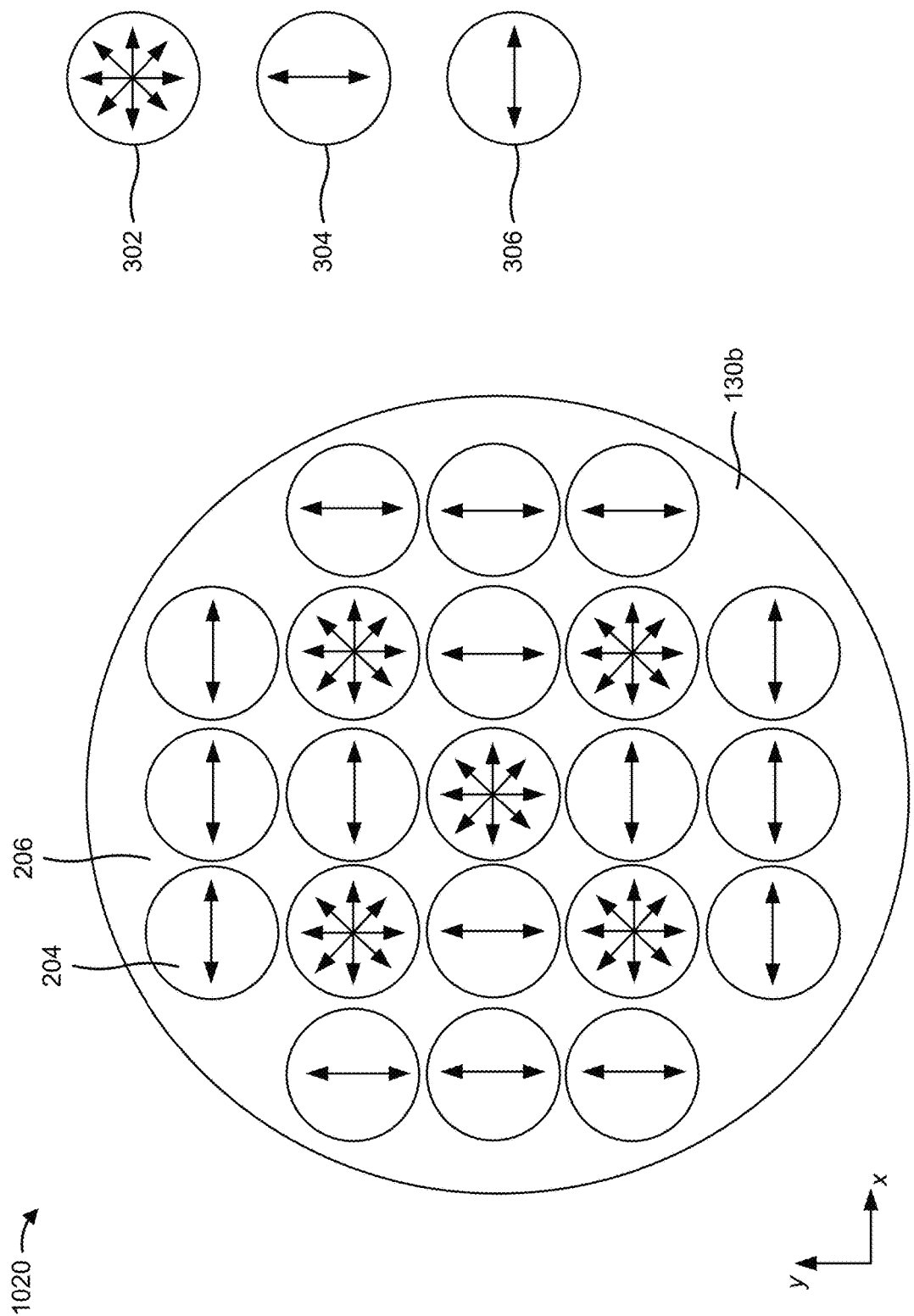

FIGS. 10A-10C are diagrams of example pixel configurations for the illumination system 130b described herein for use in the lithography system 100 of FIG. 1. The example pixel configurations described in connection with FIGS. 10A-10C enable the illumination system 130b to achieve and/or provide particular types of polarized EUV radiation (and/or other types of polarized radiation). The illumination system 130b may be configured in one or more of the example pixel configurations described in connection with FIGS. 10A-10C using fixed polarized pixels (e.g., one or more of the pixels 302, 304, and/or 306), configurable pixels 702, and/or a combination thereof. In some implementations, illumination system 130b includes configurable pixels 702 and is capable of dynamically switching between pixel configurations (and thus, polarization configurations), which enables the illumination system 130b to provide free-form polarization.

FIG. 10A illustrates an example pixel configuration 1010. In the example pixel configuration 1010, the pixels 204 are configured in a TE polarized configuration. The pixels 204 may be configured as fixed TE polarized pixels (e.g., TE polarized pixels 304 as illustrated in FIG. 5), as configurable pixels 702 that are configured in a TE polarized configuration as illustrated in FIG. 8B, or a combination thereof. In some implementations, the controller 140 transmits a signal to the pixels 204 to cause the associated actuators 724a-724c, and/or 908 (or a subset thereof) to configure the pixels 204 in the TE polarized configuration.

In the example pixel configuration 1010, the illumination system 130b is configured to generate and/or provide linear TE polarized radiation. Accordingly, the example pixel configuration 1010 may be referred to as a linear TE polarization configuration. In some implementations, the pixels 204 are configured to provide other types of linear polarized radiation such as linear TM polarized radiation.

FIG. 10B illustrates an example pixel configuration 1020. In the example pixel configuration 1020, a first subset of the pixels 204 are configured in a TE polarized configuration, a second subset of the pixels 204 are configured in a TM polarized configuration, and a third subset of the pixels 204 are configured in an unpolarized configuration. The first subset of the pixels 204 may be configured as fixed TE polarized pixels (e.g., TE polarized pixels 304 as illustrated in FIG. 5), as configurable pixels 702 that are configured in a TE polarized configuration as illustrated in FIG. 8B, or a combination thereof. The second subset of the pixels 204 may be configured as fixed TM polarized pixels (e.g., TM polarized pixels 306 as illustrated in FIG. 6), as configurable pixels 702 that are configured in a TM polarized configuration as illustrated in FIG. 8C, or a combination thereof. The third subset of the pixels 204 may be configured as fixed unpolarized pixels (e.g., unpolarized pixels 304 as illustrated in FIG. 4), as configurable pixels 702 that are configured in an unpolarized configuration as illustrated in FIG. 8A, or a combination thereof.

In the example pixel configuration 1020, the illumination system 130b is configured to generate and/or provide radial polarized radiation. Accordingly, the example pixel configuration 1020 may be referred to as a radial polarization configuration. In some implementations, the controller 140 transmits a first signal to the first subset of the pixels 204 to cause the associated actuators 724a-724c, and/or 908 (or a subset thereof) to configure the first subset of the pixels 204 in the TE polarized configuration. In some implementations, the controller 140 transmits a second signal to the second subset of the pixels 204 to cause the associated actuators 724a-724c, and/or 908 (or a subset thereof) to configure the second subset of the pixels 204 in the TM polarized configuration. In some implementations, the controller 140 transmits a third signal to the third subset of the pixels 204 to cause the associated actuators 724a-724c, and/or 908 (or a subset thereof) to configure the third subset of the pixels 204 in the unpolarized configuration.

FIG. 10C illustrates an example pixel configuration 1030. In the example pixel configuration 1030, a first subset of the pixels 204 are configured in a TE polarized configuration, a second subset of the pixels 204 are configured in a TM polarized configuration, and a third subset of the pixels 204 are configured in an unpolarized configuration. The first subset of the pixels 204 may be configured as fixed TE polarized pixels (e.g., TE polarized pixels 304 as illustrated in FIG. 5), as configurable pixels 702 that are configured in a TE polarized configuration as illustrated in FIG. 8B, or a combination thereof. The second subset of the pixels 204 may be configured as fixed TM polarized pixels (e.g., TM polarized pixels 306 as illustrated in FIG. 6), as configurable pixels 702 that are configured in a TM polarized configuration as illustrated in FIG. 8C, or a combination thereof. The third subset of the pixels 204 may be configured as fixed unpolarized pixels (e.g., unpolarized pixels 304 as illustrated in FIG. 4), as configurable pixels 702 that are configured in an unpolarized configuration as illustrated in FIG. 8A, or a combination thereof.

In the example pixel configuration 1030, the illumination system 130b is configured to generate and/or provide azimuthal polarized radiation. Accordingly, the example pixel configuration 1030 may be referred to as an azimuthal polarization configuration. In some implementations, the controller 140 transmits a first signal to the first subset of the pixels 204 to cause the associated actuators 724a-724c, and/or 908 (or a subset thereof) to configure the first subset of the pixels 204 in the TE polarized configuration. In some implementations, the controller 140 transmits a second signal to the second subset of the pixels 204 to cause the associated actuators 724a-724c, and/or 908 (or a subset thereof) to configure the second subset of the pixels 204 in the TM polarized configuration. In some implementations, the controller 140 transmits a third signal to the third subset of the pixels 204 to cause the associated actuators 724a-724c, and/or 908 (or a subset thereof) to configure the third subset of the pixels 204 in the unpolarized configuration.

It is noted that the quantity of pixels 204 included in the illumination system 130b illustrated and described in the implementations herein are examples, and other quantities of pixels 204 may be included in the illumination system 130b. Similarly, it is noted that the pixel configurations described herein for the illumination system 130b are examples, and other pixel configurations are within the scope of the present disclosure.

As indicated above, FIGS. 10A-10C are provided as examples. Other examples may differ from what is described with regard to FIGS. 10A-10C.

Figure 11:
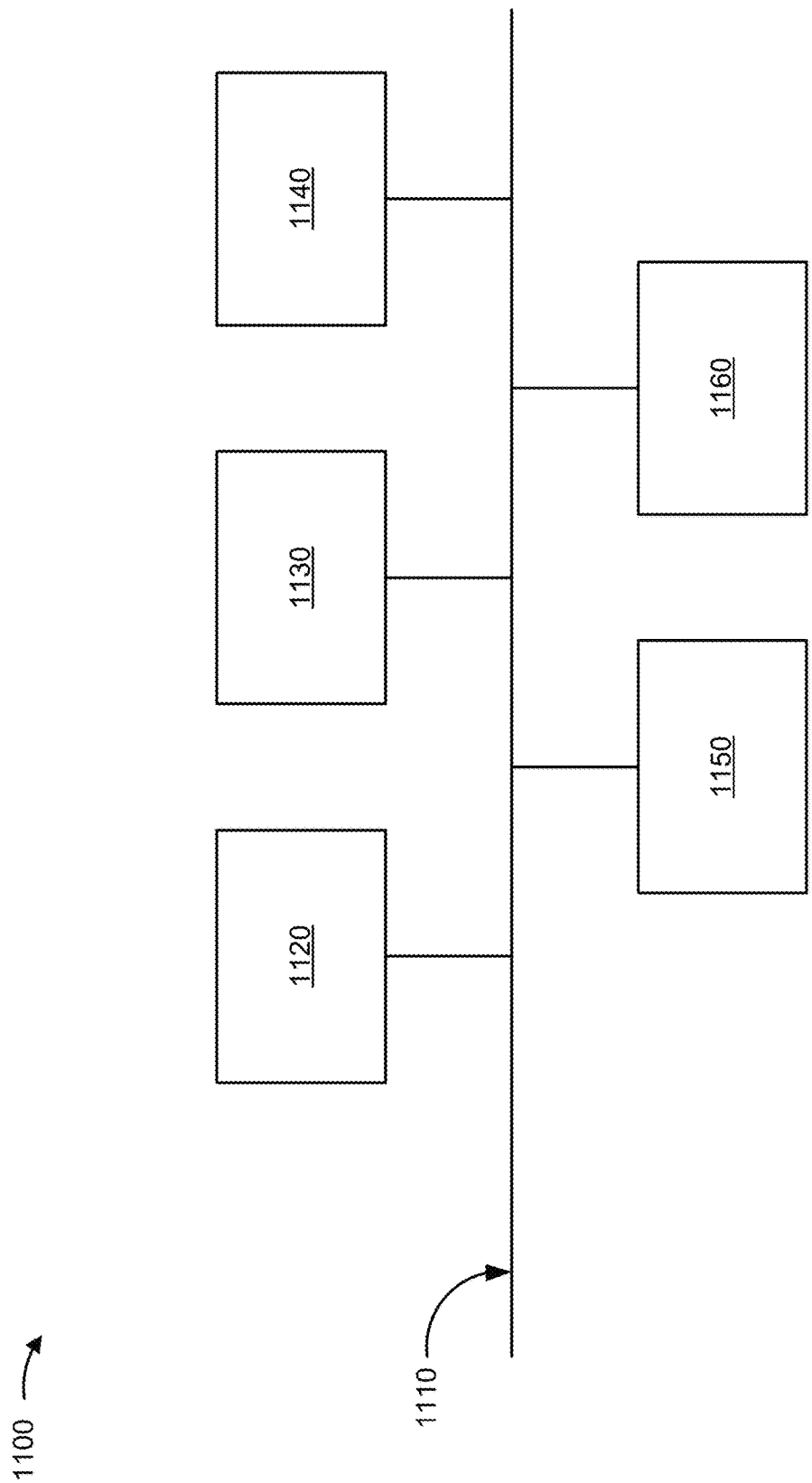
FIG. 11 is a diagram of example components of one or more devices of FIG. 1 described herein.

FIG. 11 is a diagram of example components of a device 1100, which may correspond to the controller 140, the illumination system 130b, one or more of the actuators 724a-724c, and/or another component. In some implementations, the lithography system 100, the radiation source 102, the exposure tool 104, the controller 140, the illumination system 130b, one or more of the actuators 724a-724c, and/or another component may include one or more devices 1100 and/or one or more components of device 1100. As shown in FIG. 11, device 1100 may include a bus 1110, a processor 1120, a memory 1130, an input component 1140, an output component 1150, and a communication component 1160.

Bus 1110 includes one or more components that enable wired and/or wireless communication among the components of device 1100. Bus 1110 may couple together two or more components of FIG. 11, such as via operative coupling, communicative coupling, electronic coupling, and/or electric coupling. Processor 1120 includes a central processing unit, a graphics processing unit, a microprocessor, a controller, a microcontroller, a digital signal processor, a field-programmable gate array, an application-specific integrated circuit, and/or another type of processing component. Processor 1120 is implemented in hardware, firmware, or a combination of hardware and software. In some implementations, processor 1120 includes one or more processors capable of being programmed to perform one or more operations or processes described elsewhere herein.

Memory 1130 includes volatile and/or nonvolatile memory. For example, memory 1130 may include random access memory (RAM), read only memory (ROM), a hard disk drive, and/or another type of memory (e.g., a flash memory, a magnetic memory, and/or an optical memory). Memory 1130 may include internal memory (e.g., RAM, ROM, or a hard disk drive) and/or removable memory (e.g., removable via a universal serial bus connection). Memory 1130 may be a non-transitory computer-readable medium. Memory 1130 stores information, instructions, and/or software (e.g., one or more software applications) related to the operation of device 1100. In some implementations, memory 1130 includes one or more memories that are coupled to one or more processors (e.g., processor 1120), such as via bus 1110.

Input component 1140 enables device 1100 to receive input, such as user input and/or sensed input. For example, input component 1140 may include a touch screen, a keyboard, a keypad, a mouse, a button, a microphone, a switch, a sensor, a global positioning system sensor, an accelerometer, a gyroscope, and/or an actuator. Output component 1150 enables device 1100 to provide output, such as via a display, a speaker, and/or a light-emitting diode. Communication component 1160 enables device 1100 to communicate with other devices via a wired connection and/or a wireless connection. For example, communication component 1160 may include a receiver, a transmitter, a transceiver, a modem, a network interface card, and/or an antenna.

Device 1100 may perform one or more operations or processes described herein. For example, a non-transitory computer-readable medium (e.g., memory 1130) may store a set of instructions (e.g., one or more instructions or code) for execution by processor 1120. Processor 1120 may execute the set of instructions to perform one or more operations or processes described herein. In some implementations, execution of the set of instructions, by one or more processors 1120, causes the one or more processors 1120 and/or the device 1100 to perform one or more operations or processes described herein. In some implementations, hardwired circuitry may be used instead of or in combination with the instructions to perform one or more operations or processes described herein. Additionally, or alternatively, processor 1120 may be configured to perform one or more operations or processes described herein. Thus, implementations described herein are not limited to any specific combination of hardware circuitry and software.

The number and arrangement of components shown in FIG. 11 are provided as an example. Device 1100 may include additional components, fewer components, different components, or differently arranged components than those shown in FIG. 11. Additionally, or alternatively, a set of components (e.g., one or more components) of device 1100 may perform one or more functions described as being performed by another set of components of device 1100.

Figure 12:
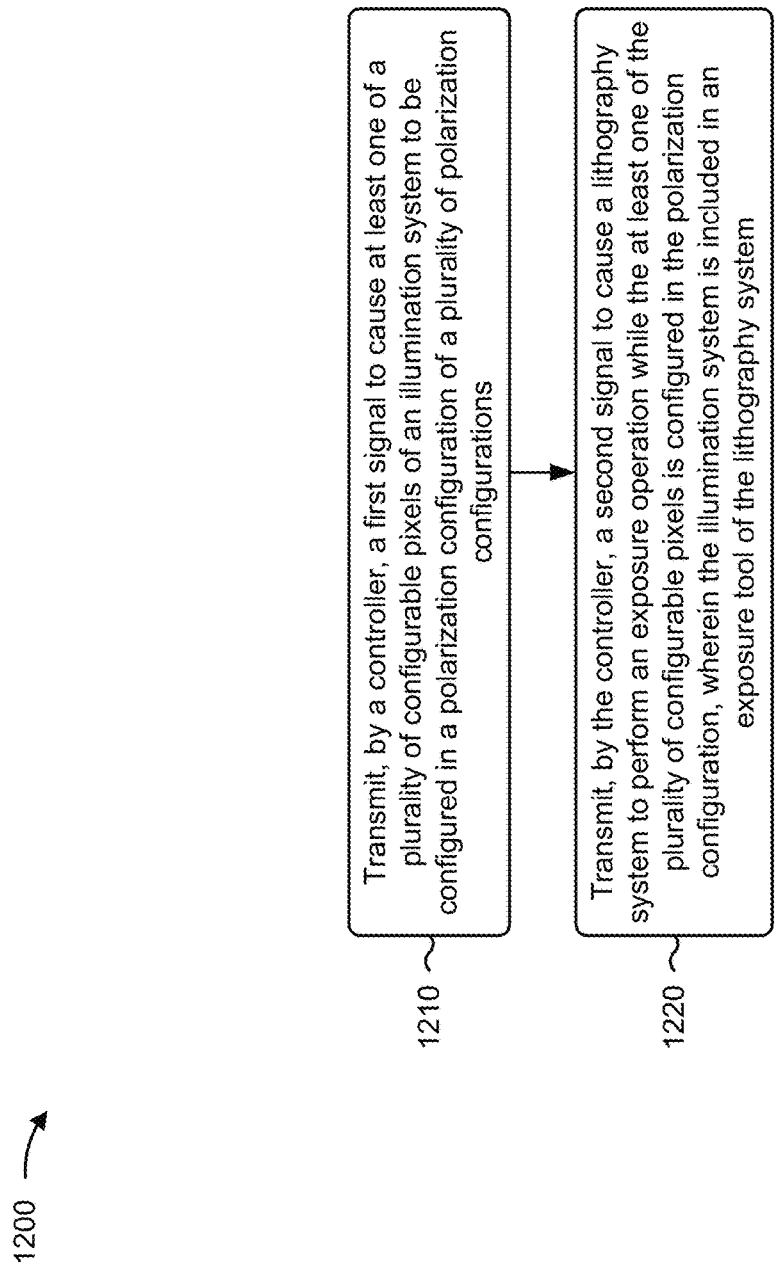
FIGS. 12-14 are flowcharts of example processes relating to configuring pixels of an illumination system described herein.

FIG. 12 is a flowchart of an example process 1200 associated with configuring a pixel of an illumination system described herein. In some implementations, one or more process blocks of FIG. 12 may be performed by a controller (e.g., the controller 140, the device 1100). In some implementations, one or more process blocks of FIG. 12 may be performed by another device or a group of devices separate from or including the controller, such as a lithography system (e.g., the lithography system 100), a radiation source (e.g., the radiation source 102), an exposure tool (e.g., the exposure tool 104), and/or an actuator (e.g., an actuator 724a-724c, 908), among other examples. Additionally, or alternatively, one or more process blocks of FIG. 12 may be performed by one or more components of device 1100, such as processor 1120, memory 1130, input component 1140, output component 1150, and/or communication component 1160.

As shown in FIG. 12, process 1200 may include transmitting a first signal to cause at least one of a plurality of configurable pixels of an illumination system to be configured in a polarization configuration of a plurality of polarization configurations (block 1210). For example, the controller 140 may transmit a first signal to cause at least one of a plurality of configurable pixels 702 of the illumination system 130b to be configured in a polarization configuration of a plurality of polarization configurations (e.g., the polarization configurations described in connection with the example implementations 700, 810-840, and/or 900), as described above.

As further shown in FIG. 12, process 1200 may include transmitting a second signal to cause a lithography system to perform an exposure operation while the at least one of the plurality of configurable pixels is configured in the polarization configuration (block 1220). For example, the controller 140 may transmit a second signal to cause a lithography system 100 to perform an exposure operation while the at least one of the plurality of configurable pixels 702 is configured in the polarization configuration, as described above. In some implementations, the illumination system 130*b* is included in the exposure tool 104 of the lithography system 100.

Process 1200 may include additional implementations, such as any single implementation or any combination of implementations described below and/or in connection with one or more other processes described elsewhere herein.

In a first implementation, transmitting the first signal includes transmitting the first signal to cause each of the plurality of configurable pixels 702 to be configured in respective polarization configurations prior to the exposure operation. In a second implementation, alone or in combination with the first implementation, transmitting the first signal includes transmitting the first signal to cause each of the plurality of configurable pixels 702 to be configured in respective polarization configurations during the exposure operation. In a third implementation, alone or in combination with one or more of the first and second implementations, process 1200 includes determining (e.g., by the controller 140) a particular combination of respective polarization configurations for the plurality of configurable pixels 702 based on at least one of a contrast parameter for the exposure operation, or a throughput parameter for the exposure operation.

In a fourth implementation, alone or in combination with one or more of the first through third implementations, transmitting the first signal includes transmitting the first signal to cause at least a subset of the plurality of configurable pixels 702 to be configured in a TE polarized configuration (e.g., as illustrated in the example implementation 820). In a fifth implementation, alone or in combination with one or more of the first through fourth implementations, transmitting the first signal includes transmitting the first signal to cause a first subset of the plurality of configurable pixels 702 to be configured in a TE polarized configuration (e.g., as illustrated in the example implementation 820 as illustrated in the example implementation 820), a second subset of the plurality of configurable pixels 702 to be configured in a TM polarized configuration (e.g., as illustrated in the example implementation 830), and a third subset of the plurality of configurable pixels 702 to be configured in an unpolarized configuration (e.g., as illustrated in the example implementation 810). In a sixth implementation, alone or in combination with one or more of the first through fifth implementations, transmitting the first signal includes transmitting the first signal to respective one or more actuators 724*a*-724*c* and/or 908 associated with each of the plurality of configurable pixels 702 to cause the respective one or more actuators 724*a*-724*c* and/or 908 to configure the plurality of configurable pixels 702 in the respective polarization configurations.

Although FIG. 12 shows example blocks of process 1200, in some implementations, process 1200 may include additional blocks, fewer blocks, different blocks, or differently arranged blocks than those depicted in FIG. 12. Additionally, or alternatively, two or more of the blocks of process 1200 may be performed in parallel.

Figure 13:
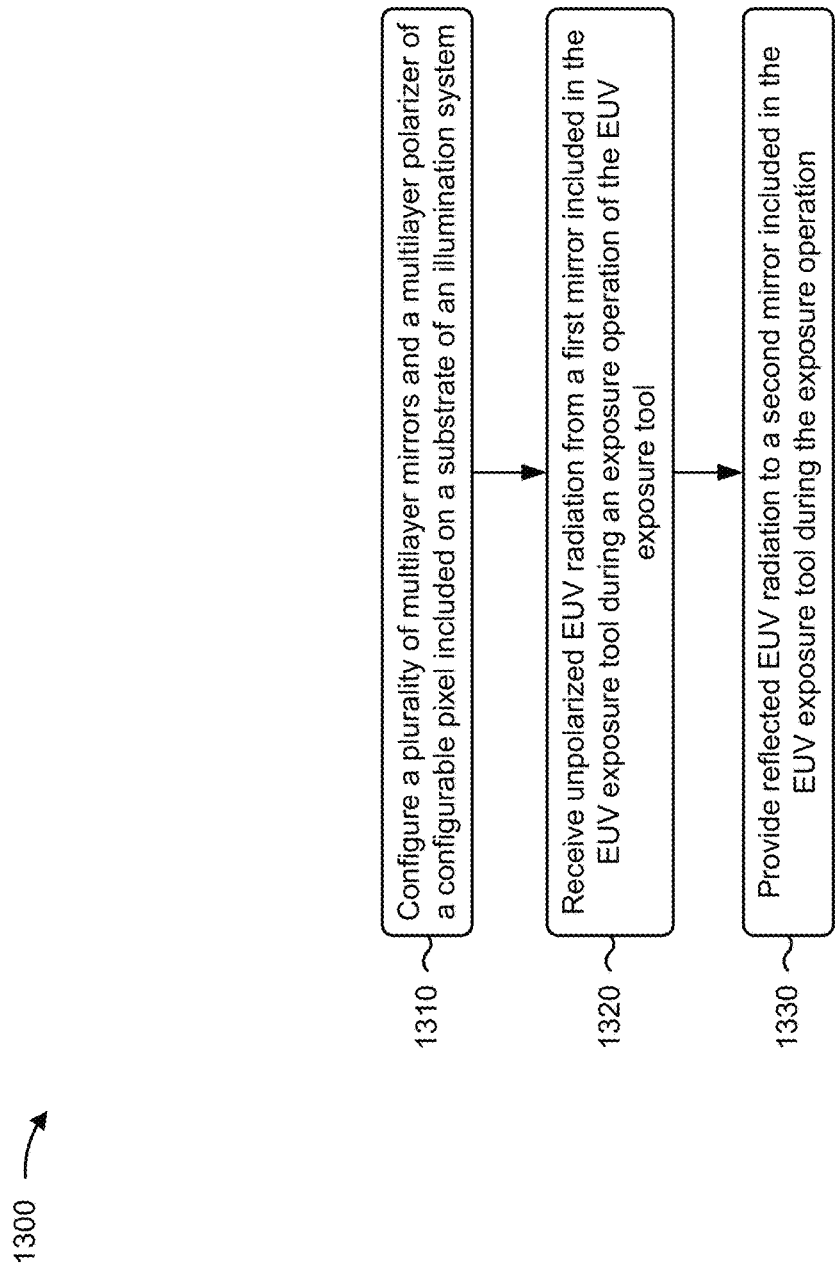

FIG. 13 is a flowchart of an example process 1300 associated with configuring a pixel of an illumination system described herein. In some implementations, one or more process blocks of FIG. 13 may be performed by an illumination system (e.g., the illumination system 130*b*, the device 1100). In some implementations, one or more process blocks of FIG. 13 may be performed by another device or a group of devices separate from or including the illumination system, such as a lithography system (e.g., the lithography system 100), a radiation source (e.g., the radiation source 102), an exposure tool (e.g., the exposure tool 104), a controller (e.g., the controller 140), and/or an actuator (e.g., an actuator 724*a*-724*c*), among other examples. Additionally, or alternatively, one or more process blocks of FIG. 13 may be performed by one or more components of device 1100, such as processor 1120, memory 1130, input component 1140, output component 1150, and/or communication component 1160.

As shown in FIG. 13, process 1300 may include configuring a plurality of multilayer mirrors and a multilayer polarizer of a configurable pixel included on a substrate of an illumination system (block 1310). For example, the illumination system 130*b* (e.g., the actuators 724*a*-724*c* and/or 908 of the illumination system 130*b*) may configure the multilayer mirrors 402*a* and 402*b* and the multilayer polarizer 502 of a configurable pixel 702 included on the substrate 206 of the illumination system 130*b*, as described above. In some implementations, the illumination system 130*b* is included in an EUV exposure tool (e.g., the exposure tool 104) of the lithography system 100. In some implementations, the plurality of multilayer mirrors 402*a* and 402*b* and the multilayer polarizer 502 are configured such that the configurable pixel 702 is configured in a particular polarization configuration (e.g., the polarization configurations described in connection with the example implementations 700, 810-840, and/or 900).

As further shown in FIG. 13, process 1300 may include receiving unpolarized EUV radiation from a first mirror included in the EUV exposure tool during an exposure operation of the EUV exposure tool (block 1320). For example, the illumination system 130*b* may receive unpolarized EUV radiation (e.g., the unpolarized radiation 208) from a first mirror (e.g., the mirror 130*a*) included in the EUV exposure tool during an exposure operation of the EUV exposure tool, as described above.

As further shown in FIG. 13, process 1300 may include providing reflected EUV radiation to a second mirror included in the EUV exposure tool during the exposure operation (block 1330). For example, the illumination system 130*b* may provide reflected EUV radiation (e.g., the unpolarized radiation 208, the reflected TM polarized radiation 704*b*, and/or the reflected TE polarized radiation 706) to a second mirror (e.g., the mirror 132) included in the EUV exposure tool during the exposure operation, as described above. In some implementations, a polarization of the reflected EUV radiation is based on the unpolarized EUV radiation and the particular polarization configuration of the configurable pixel 702.

Process 1300 may include additional implementations, such as any single implementation or any combination of implementations described below and/or in connection with one or more other processes described elsewhere herein.

In a first implementation, the particular polarization configuration includes a TE polarization configuration (e.g., as illustrated in the example implementation 820), and configuring the plurality of multilayer mirrors 402*a* and 402*b* and the multilayer polarizer 502 includes actuating a multilayer mirror (e.g., the multilayer mirror 402a), of the plurality of multilayer mirrors 402a and 402b, below the multilayer polarizer 502 such that the reflected EUV radiation includes a 1E polarized component (e.g., the reflected TE polarized radiation 706) of the unpolarized EUV radiation (e.g., the unpolarized radiation 208).

In a second implementation, alone or in combination with the first implementation, providing the reflected EUV radiation includes polarizing, using the multilayer polarizer 502, the unpolarized EUV radiation (e.g., the unpolarized radiation 208) into the TE polarized component and a TM polarized component (e.g., the transmitted TM polarized radiation 704a), and reflecting, using another multilayer mirror (e.g., the multilayer mirror 402b) of the plurality of multilayer mirrors 402a and 402b, the TE polarized component toward the second mirror (e.g., the mirror 132), the other multilayer mirror (e.g., the multilayer mirror 402b) is adjacent to the multilayer polarizer 502, and the TM polarized component is directed away from the second mirror (e.g., the mirror 132) by the multilayer mirror (e.g., the multilayer mirror 402a).

In a third implementation, alone or in combination with one or more of the first and second implementations, the particular polarization configuration includes a TM polarization configuration (e.g., as illustrated in the example implementation 830), and configuring the plurality of multilayer mirrors 402a and 402b and the multilayer polarizer 502 includes actuating a multilayer mirror e.g., the multilayer mirror 402b), of the plurality of multilayer mirrors 402a and 402b, adjacent to the multilayer polarizer 502 such that the reflected EUV radiation includes a TM polarized component (e.g., the reflected TM polarized radiation 704b) of the unpolarized EUV radiation (e.g., the unpolarized radiation 208).

In a fourth implementation, alone or in combination with one or more of the first through third implementations, providing the reflected EUV radiation includes polarizing, using the multilayer polarizer 502, the unpolarized EUV radiation (e.g., the unpolarized radiation 208) into the TM polarized component and a TE polarized component (e.g., the reflected TE polarized radiation 706), and reflecting, using another multilayer mirror (e.g., the multilayer mirror 402a) of the plurality of multilayer mirrors 402a and 402b, the TM polarized component toward the second mirror (e.g., the mirror 132), where the other multilayer mirror (e.g., the multilayer mirror 402a) is below the multilayer polarizer 502, and the TE polarized component is directed away from the second mirror (e.g., the mirror 132) by the multilayer mirror e.g., the multilayer mirror 402b).

In a fifth implementation, alone or in combination with one or more of the first through fourth implementations, the particular polarization configuration includes an unpolarized polarization configuration (e.g., as illustrated in the example implementation 810), and configuring the plurality of multilayer mirrors 402a and 402b and the multilayer polarizer 502 includes actuating the multilayer polarizer 502 such that the reflected EUV radiation includes the unpolarized EUV radiation (e.g., the unpolarized radiation 208).

In a sixth implementation, alone or in combination with one or more of the first through fifth implementations, providing the reflected EUV radiation includes reflecting, using a multilayer mirror (e.g., the multilayer mirror 402a) of the plurality of multilayer mirrors 402a and 402b, the unpolarized EUV radiation toward the second mirror (e.g., the mirror 132), where the multilayer mirror (e.g., the multilayer mirror 402a) is below the multilayer polarizer 502.

Although FIG. 13 shows example blocks of process 1300, in some implementations, process 1300 may include additional blocks, fewer blocks, different blocks, or differently arranged blocks than those depicted in FIG. 13. Additionally, or alternatively, two or more of the blocks of process 1300 may be performed in parallel.

Figure 14:
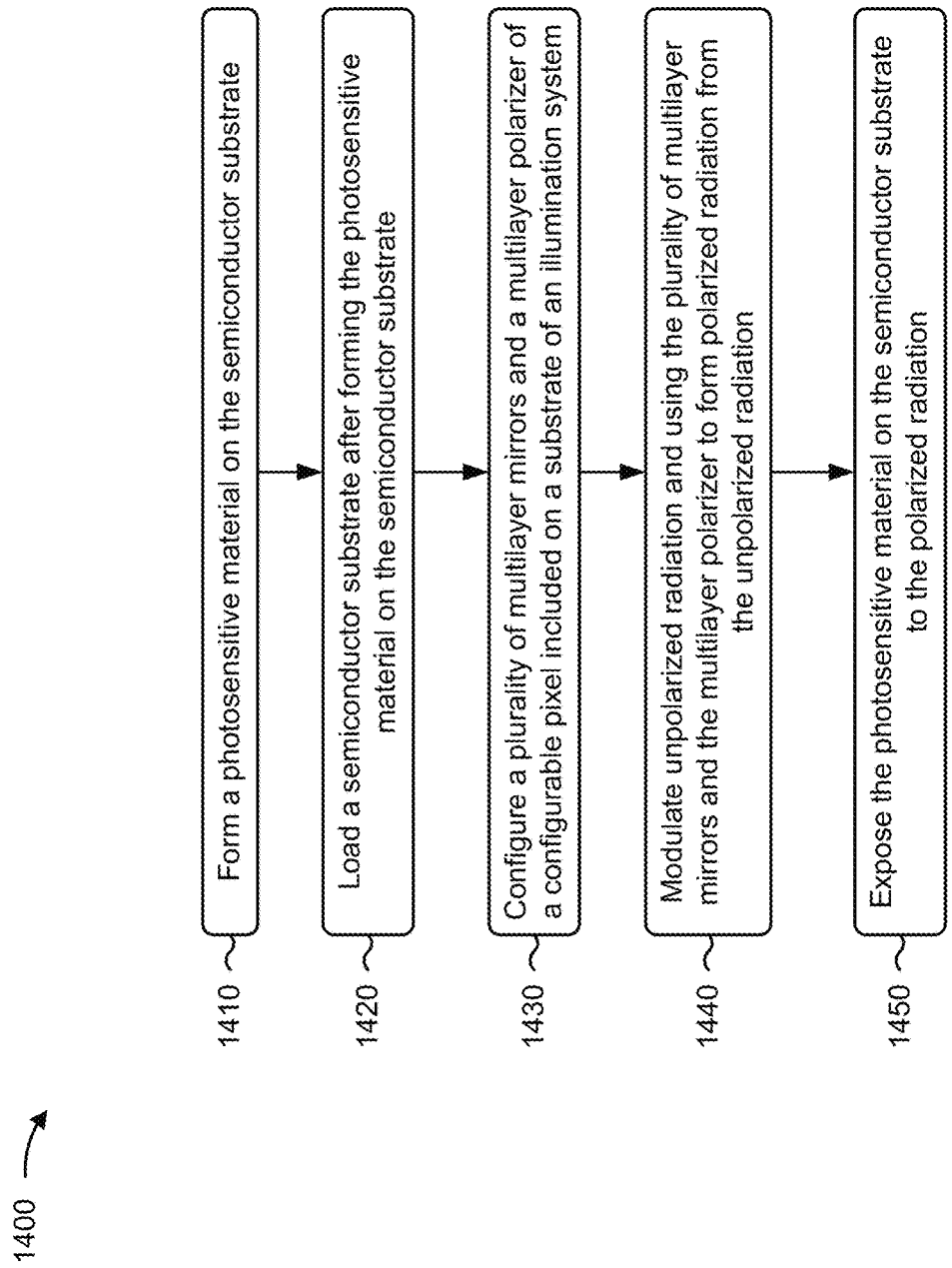

FIG. 14 is a flowchart of an example process 1400 associated with configuring a pixel of an illumination system described herein. In some implementations, one or more process blocks of FIG. 14 may be performed by an illumination system (e.g., the illumination system 130b, the device 1100). In some implementations, one or more process blocks of FIG. 14 may be performed by another device or a group of devices separate from or including the illumination system, such as a lithography system (e.g., the lithography system 100), a radiation source (e.g., the radiation source 102), an exposure tool (e.g., the exposure tool 104), a controller (e.g., the controller 140), and/or an actuator (e.g., an actuator 724a-724c), among other examples. Additionally, or alternatively, one or more process blocks of FIG. 14 may be performed by one or more components of device 1100, such as processor 1120, memory 1130, input component 1140, output component 1150, and/or communication component 1160.

As further shown in FIG. 14, process 1400 may include forming a photosensitive material on a semiconductor substrate (block 1410). For example, a deposition tool such as a spin-coating tool and/or another type of deposition tool may form a photosensitive material on a semiconductor substrate 110, as described herein. The photosensitive material may include a photoresist, such as a positive photoresist, a negative photoresist, and/or another type of photoresist.

As shown in FIG. 14, process 1400 may include loading the semiconductor substrate after forming the photosensitive material on the semiconductor substrate (block 1420). For example, the lithography system 100 may load the semiconductor substrate 110 onto a substrate stage 136 of the lithography system 100 after the deposition tool forms the photosensitive material on the semiconductor substrate 110, as described herein.

As further shown in FIG. 14, process 1400 may include configuring a plurality of multilayer mirrors and a multilayer polarizer of a configurable pixel included on a substrate of an illumination system (block 1430). For example, the illumination system 130b (e.g., the actuators 724a-724c and/or 908 of the illumination system 130b) may configure the multilayer mirrors 402a and 402b and the multilayer polarizer 502 of a configurable pixel 702 included on the substrate 206 of the illumination system 130b, as described above. In some implementations, the illumination system 130b is included in an EUV exposure tool (e.g., the exposure tool 104) of the lithography system 100. In some implementations, the plurality of multilayer mirrors 402a and 402b and the multilayer polarizer 502 are configured such that the configurable pixel 702 is configured in a particular polarization configuration (e.g., the polarization configurations described in connection with the example implementations 700, 810-840, and/or 900).

As further shown in FIG. 14, process 1400 may include modulating unpolarized radiation and using the plurality of multilayer mirrors and the multilayer polarizer to form polarized radiation from the unpolarized radiation (block 1440). For example, the lithography system 100 may modulate unpolarized radiation and using the plurality of multilayer mirrors and the multilayer polarizer to form polarized radiation from the unpolarized radiation. In some implementations, the lithography system 100 modulates the unpolarized radiation by generating a laser beam 120, which is used to generate EUV radiation 106 from droplets 118, and by modulating the EUV radiation 106 that is provided to an exposure tool of the lithography system 100 where the plurality of multilayer mirrors and the multilayer polarizer are included.

As further shown in FIG. 14, process 1400 may include exposing the photosensitive material on the semiconductor substrate to the polarized radiation (block 1450). For example, the lithography system 100 may expose the photosensitive material on the semiconductor substrate 110 to the polarized radiation, as described herein. In some implementations, the polarized radiation is based on a particular polarization configuration of the configurable pixel.

Process 1400 may include additional implementations, such as any single implementation or any combination of implementations described below and/or in connection with one or more other processes described elsewhere herein.

In a first implementation, the particular polarization configuration includes a transverse electric (TE) polarization configuration, and configuring the plurality of multilayer mirrors and the multilayer polarizer includes actuating a multilayer mirror, of the plurality of multilayer mirrors, below the multilayer polarizer such that the polarized radiation includes a TE polarized component of the unpolarized radiation.

In a second implementation, alone or in combination with the first implementation, modulating the unpolarized radiation and using the plurality of multilayer mirrors and the multilayer polarizer to form the polarized radiation from the unpolarized radiation includes polarizing, using the multilayer polarizer, the unpolarized radiation into the TE polarized component and a transverse magnetic (TM) polarized component, and reflecting, using another multilayer mirror of the plurality of multilayer mirrors, the TE polarized component.

In a third implementation, alone or in combination with one or more of the first and second implementations, the particular polarization configuration includes a transverse magnetic (TM) polarization configuration, and configuring the plurality of multilayer mirrors and the multilayer polarizer includes actuating a multilayer mirror, of the plurality of multilayer mirrors, adjacent to the multilayer polarizer such that the polarized radiation includes a TM polarized component of the unpolarized radiation.

In a fourth implementation, alone or in combination with one or more of the first through third implementations, modulating the unpolarized radiation and using the plurality of multilayer mirrors and the multilayer polarizer to form the polarized radiation from the unpolarized radiation includes polarizing, using the multilayer polarizer, the unpolarized radiation into the TM polarized component and a transverse electric (TE) polarized component.

In a fifth implementation, alone or in combination with one or more of the first through fourth implementations, the particular polarization configuration includes an unpolarized polarization configuration, and configuring the plurality of multilayer mirrors and the multilayer polarizer includes actuating the multilayer polarizer such that the unpolarized radiation is directed toward the semiconductor substrate.

In a sixth implementation, alone or in combination with one or more of the first through fifth implementations, the multilayer mirror is below the multilayer polarizer.

Although FIG. 14 shows example blocks of process 1400, in some implementations, process 1400 includes additional blocks, fewer blocks, different blocks, or differently arranged blocks than those depicted in FIG. 14. Additionally, or alternatively, two or more of the blocks of process 1400 may be performed in parallel.

In this way, an illumination system includes a plurality of pixels (or spots) that are (or may be) configured in one or more polarization configuration types. The pixels of the illumination system may be configured to promote particular types of polarization (e.g., transverse electric (TE) polarization, transvers magnetic (TM) polarization) to increase pattern contrast while achieving suitable exposure operation throughput. Moreover, the pixels of the pixels of the illumination system may be configured to achieve free-form (arbitrary or freely-configurable) polarization, which permits the polarization of radiation to be tailored to particular exposure operation patterns and other parameters.

As described in greater detail above, some implementations described herein provide a method. The method includes forming a photosensitive material on a semiconductor substrate. The method includes loading the semiconductor substrate after forming the photosensitive material on the semiconductor substrate. The method includes configuring a plurality of multilayer mirrors and a multilayer polarizer of a configurable pixel included on a substrate of an illumination system. The method includes modulating unpolarized radiation and using the plurality of multilayer mirrors and the multilayer polarizer to form polarized radiation from the unpolarized radiation. The method includes exposing the photosensitive material on the semiconductor substrate to the polarized radiation. The polarized radiation is based on a particular polarization configuration of the configurable pixel.

As described in greater detail above, some implementations described herein provide a method. The method includes transmitting, by a controller, a first signal to cause at least one of a plurality of configurable pixels of an illumination system to be configured in a polarization configuration of a plurality of polarization configurations. The method includes transmitting, by the controller, a second signal to cause a lithography system to perform an exposure operation while the at least one of the plurality of configurable pixels is configured in the polarization configuration, where the illumination system is included in an exposure tool of the lithography system.

As described in greater detail above, some implementations described herein provide a method. The method includes configuring a plurality of multilayer mirrors and a multilayer polarizer of a configurable pixel included on a substrate of an illumination system, where the illumination system is included in an EUV exposure tool of a lithography system, and where the plurality of multilayer mirrors and the multilayer polarizer are configured such that the configurable pixel is configured in a particular polarization configuration. The method includes receiving unpolarized EUV radiation from a first mirror included in the EUV exposure tool during an exposure operation of the EUV exposure tool. The method includes providing reflected EUV radiation to a second mirror included in the EUV exposure tool during the exposure operation, where a polarization of the reflected EUV radiation is based on the unpolarized EUV radiation and the particular polarization configuration of the configurable pixel.

As described in greater detail above, some implementations described herein provide an illumination system for use in an EUV exposure tool. The illumination system for use in an EUV exposure tool includes a substrate. The illumination system for use in an EUV exposure tool includes a plurality of fixed IL polarized pixels. The illumination system for use in an EUV exposure tool includes a plurality of configurable pixels that are each capable of being selectively configured in a respective polarization configuration of a plurality of polarization configurations, where the plurality of polarization configurations include a TE polarized configuration, a TM polarized configuration, a TE polarized and TM polarized configuration, or an unpolarized configuration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a photosensitive material on a semiconductor substrate;
    loading the semiconductor substrate after forming the photosensitive material on the semiconductor substrate;
    configuring a plurality of multilayer mirrors and a multilayer polarizer of a configurable pixel included on a substrate of an illumination system, wherein the configurable pixel is capable of switching between different polarization configurations of a plurality of polarization configurations;
    modulating unpolarized radiation and using the plurality of multilayer mirrors and the multilayer polarizer to form polarized radiation from the unpolarized radiation; and
    exposing the photosensitive material on the semiconductor substrate to the polarized radiation, wherein the polarized radiation is based on a particular polarization configuration of the plurality of polarization configurations.

2. The method of claim 1, wherein the particular polarization configuration comprises a transverse electric (TE) polarization configuration; and
    wherein configuring the plurality of multilayer mirrors and the multilayer polarizer comprises:
        actuating a multilayer mirror, of the plurality of multilayer mirrors, below the multilayer polarizer such that the polarized radiation comprises a TE polarized component of the unpolarized radiation.

3. The method of claim 2, wherein modulating the unpolarized radiation and using the plurality of multilayer mirrors and the multilayer polarizer to form the polarized radiation from the unpolarized radiation comprises:
    polarizing, using the multilayer polarizer, the unpolarized radiation into the TE polarized component and a transverse magnetic (TM) polarized component; and
    reflecting, using another multilayer mirror of the plurality of multilayer mirrors, the TE polarized component.

4. The method of claim 2, wherein the particular polarization configuration comprises a transverse magnetic (TM) polarization configuration; and
    wherein configuring the plurality of multilayer mirrors and the multilayer polarizer comprises:
        actuating a multilayer mirror, of the plurality of multilayer mirrors, adjacent to the multilayer polarizer such that the polarized radiation comprises a TM polarized component of the unpolarized radiation.

5. The method of claim 4, wherein modulating the unpolarized radiation and using the plurality of multilayer mirrors and the multilayer polarizer to form the polarized radiation from the unpolarized radiation comprises:
    polarizing, using the multilayer polarizer, the unpolarized radiation into the TM polarized component and a transverse electric (TE) polarized component.

6. The method of claim 1, wherein the particular polarization configuration comprises an unpolarized polarization configuration; and
    wherein configuring the plurality of multilayer mirrors and the multilayer polarizer comprises:
        actuating the multilayer polarizer such that the unpolarized radiation is directed toward the semiconductor substrate.

7. The method of claim 6, wherein the multilayer mirror is below the multilayer polarizer.

8. An illumination system for use in an extreme ultraviolet (EUV) exposure tool, comprising:
    a substrate;
    a plurality of fixed transverse electric (TE) polarized pixels; and
    a plurality of configurable pixels that are each capable of being selectively configured in a respective polarization configuration of a plurality of polarization configurations, wherein the plurality of polarization configurations comprise:
        a TE polarized configuration,
        a transverse magnetic (TM) polarized configuration, a TE polarized and TM polarized configuration, or
        an unpolarized configuration, and
    wherein one or more of the plurality of configurable pixels are capable of selectively switching between different polarization configurations of the plurality of polarization configurations.

9. The illumination system of claim 8, further comprising:
    a controller configured to selectively configure the plurality of configurable pixels in the respective polarization configuration.

10. The illumination system of claim 9, wherein a configurable pixel of the plurality of configurable pixels includes an actuator configured to:
    communicate with the controller to receive a signal; and
    actuate, based on the signal, at least one of a multilayer polarizer or a multilayer mirror to selectively configure the configurable pixel in a polarization configuration of the plurality of polarization configurations.

11. The illumination system of claim 8, wherein a configurable pixel of the plurality of configurable pixels comprises:
    a multilayer polarizer; and
    a plurality of multilayer mirrors.

12. The illumination system of claim 11, wherein the multilayer polarizer, when configured in the TE polarized and TM polarized configuration, is configured to:
    transmit a TM polarized component, of unpolarized EUV radiation incident toward the configurable pixel, toward a first multilayer mirror of the plurality of multilayer mirrors; and
    reflect a TE polarized component of the unpolarized EUV radiation toward a second multilayer mirror of the plurality of multilayer mirrors.

13. The illumination system of claim 11, wherein the configurable pixel further comprises:
a tunable mirror configured to reflect EUV radiation, that is reflected from the multilayer polarizer, toward a multilayer mirror of the plurality of multilayer mirrors.

14. A method, comprising:
transmitting, by a controller, a first signal to cause at least one of a plurality of configurable pixels of an illumination system to be configured in a polarization configuration of a plurality of polarization configurations, wherein the at least one of the plurality of configurable pixels is capable of switching between different polarization configurations of the plurality of polarization configurations; and
transmitting, by the controller, a second signal to cause a lithography system to perform an exposure operation while the at least one of the plurality of configurable pixels is configured in the polarization configuration, wherein the illumination system is included in an exposure tool of the lithography system.

15. The method of claim 14, wherein transmitting the first signal comprises:
transmitting the first signal to cause each of the plurality of configurable pixels to be configured in respective polarization configurations, of the plurality of polarization configurations, prior to the exposure operation.

16. The method of claim 14, wherein transmitting the first signal comprises:
transmitting the first signal to cause each of the plurality of configurable pixels to be configured in respective polarization configurations, of the plurality of polarization configurations, during the exposure operation.

17. The method of claim 14, further comprising:
determining a particular combination of respective polarization configurations, of the plurality of polarization configurations, for the plurality of configurable pixels based on at least one of:
a contrast parameter for the exposure operation, or
a throughput parameter for the exposure operation.

18. The method of claim 14, wherein the polarization configuration is a transverse electric (TE) polarized configuration.

19. The method of claim 14, wherein transmitting the first signal comprises:
transmitting the first signal to cause:
a first subset of the plurality of configurable pixels to be configured in a transverse electric (TE) polarized configuration of the plurality of polarization configurations,
a second subset of the plurality of configurable pixels to be configured in a transverse magnetic (TM) polarized configuration of the plurality of polarization configurations, and
a third subset of the plurality of configurable pixels to be configured in an unpolarized configuration.

20. The method of claim 14, wherein transmitting the first signal comprises:
transmitting the first signal to respective one or more actuators associated with each of the plurality of configurable pixels to cause the respective one or more actuators to configure the plurality of configurable pixels in respective polarization configurations.

* * * * *